(12) United States Patent
Deslandes

(10) Patent No.: US 8,963,748 B2
(45) Date of Patent: *Feb. 24, 2015

(54) COMPRESSION AND DECOMPRESSION OF NUMERICAL DATA

(71) Applicant: Dassault Systemes, Velizy Villacoublay Cedex (FR)

(72) Inventor: Arnaud Deslandes, Suresnes (FR)

(73) Assignee: Dassault Systemes, Velizy Villacoublay (FR)

( * ) Notice: Subject to any disclaimer, the term of this patent is extended or adjusted under 35 U.S.C. 154(b) by 147 days.

This patent is subject to a terminal disclaimer.

(21) Appl. No.: 13/734,531

(22) Filed: Jan. 4, 2013

(65) Prior Publication Data

US 2013/0124589 A1    May 16, 2013

Related U.S. Application Data

(63) Continuation of application No. 13/101,574, filed on May 5, 2011, now Pat. No. 8,368,568.

(30) Foreign Application Priority Data

May 11, 2010 (EP) .................................. 10305502

(51) Int. Cl.
| | | |
|---|---|---|
| G06F 17/10 | (2006.01) |
| H03M 7/24 | (2006.01) |
| H03M 7/30 | (2006.01) |
| G06T 9/00 | (2006.01) |

(52) U.S. Cl.
CPC . *G06F 17/10* (2013.01); *G06T 9/00* (2013.01); *H03M 7/24* (2013.01); *H03M 7/30* (2013.01); *Y10S 706/919* (2013.01)

USPC ............................................. 341/76; 706/919

(58) Field of Classification Search
USPC ................................................ 341/51, 76, 77
See application file for complete search history.

(56) References Cited

U.S. PATENT DOCUMENTS

| | | |
|---|---|---|
| 5,793,371 A | 8/1998 | Deering |
| 5,825,369 A | 10/1998 | Rossignac et al. |
| 5,842,004 A | 11/1998 | Deering et al. |
| 5,867,167 A | 2/1999 | Deering |
| 5,870,094 A | 2/1999 | Deering |

(Continued)

OTHER PUBLICATIONS

Isenburg et al. Lossless Compression of Predicted Floating-Point Geometry, 2005, Elsevier/Science Direct Computer Aided Design 37 (2005) pp. 869-877.*

(Continued)

*Primary Examiner* — Howard Williams
(74) *Attorney, Agent, or Firm* — Hamilton, Brook, Smith & Reynolds, P.C.

(57) ABSTRACT

The invention relates to a computer-implemented method for compressing numerical data comprising a structured set of floating point actual values. A floating point value is defined by a sign, an exponent and a mantissa. The method comprises computing a floating point predicted value related to a target actual value of the set. The computing includes performing operations on integers corresponding to the sign, to the exponent and/or to the mantissa of actual values of a subset of the set. The method also comprises storing a bit sequence representative of a difference between integers derived from the target actual value and the predicted value. Such a method is particularly efficient for reducing the storage size of a CAD file.

16 Claims, 14 Drawing Sheets

(56) References Cited

U.S. PATENT DOCUMENTS

| | | | |
|---|---|---|---|
| 5,905,502 | A | 5/1999 | Deering |
| 5,905,507 | A | 5/1999 | Rossignac et al. |
| 5,933,153 | A | 8/1999 | Deering et al. |
| 6,028,541 | A | 2/2000 | Levine |
| 6,047,088 | A | 4/2000 | Van Beek et al. |
| 6,167,159 | A | 12/2000 | Touma et al. |
| 6,215,500 | B1 | 4/2001 | Deering |
| 6,239,805 | B1 | 5/2001 | Deering |
| 6,522,327 | B2 | 2/2003 | Deering |
| 6,525,722 | B1 | 2/2003 | Deering |
| 6,532,012 | B2 | 3/2003 | Deering |
| 8,368,568 | B2 | 2/2013 | Deslandes |
| 2006/0284747 | A1 | 12/2006 | Moriya |

OTHER PUBLICATIONS

G. Farin, Curves and Surfaces for CAGD A Practical Guide, Chapter 8 pp. 119-146, 2002 Academic Press.*

Engelson, V. et al., Lossless Compression of High-Volume Numerical Data from Simulations, IEEE, IEEE Data Compression Conference 2000, Mar. 2000.*

Goldberg, D., "What Every Computer Scientist Should Know About Floating-Point Arithmetic," *ACM Computing Surveys*, 23(1):1-48 (1991).

Ibarria, L., et al., "Out-of-Core Compression and Decompression of Large *n*-Dimensional Scalar Fields," *Eurographics*, 22(3):333-348 (2003).

IEEE Standard for Binary Floating-Point Arithmetic: An American National Standard, IEEE: Std 7514-1985, 20 pages.

Isenburg, M., et al., "Compressing Polygon Mesh Geometry with Parallelogram Prediction," *Visualization*, 141-146 (2002).

Isenburg, M, et al., "Lossless Compression of Predicted Floating-Point Geometry," *Computer Aided Design*, 37:869-877 (2005).

Ratanaworabhan, P., et al., "Fast Lossless Compression of Scientific Floating-Point Data," *Proceedings of the Data Compression Conference*, (2006).

Taubin, G., et al., "Geometric Compression Through Topological Surgery," ACM Transactions on Graphics, 17(2):84-115 (1998).

Touma, C., et al., "Triangle Mesh Compression," *Graphics Interface*, pp. 26-34 (1998).

European Search Report from EP 10305502.6 dated Dec. 15, 2010.

Isenburg, M., et al. "Lossless Compression of Predicted Floating-Point Geometry" Computer-Aided Design, 37:8, pp. 869-877, Jul. 1, 2005.

Lindstrom, P., et al. "Fast and Efficient Compression of Floating-Point Data" IEEE Transactions on Visualization and Computer Graphics, 12:5 pp. 1245-1250, Sep./Oct. 2006.

Deering, M. "Geometry Compression" Computer Graphics Proceedings, Annual Conference Series, pp. 13-20; Jun. 8, 1995.

Burtscher, M., et al., "FPC: A High-Speed Compressor for Double-Precision Floating-Data," IEEE Transactions on Computers, 58(1): 18-31 (2009).

Katahira, K., et al., "FPGA-based Lossless Compressors of Floating-Point Data Streams to Enhance Memory Bandwidth," 2010 $21^{st}$ IEEE International Conference on Application-Specific Systems Architectures and Processors (ASAP), pp. 246-253, 7-9 Jul. 2010.

O'Neil, M., et al., "Floating-Point Data Compression at 75 Gb/s on a GPU," Association of Computing Machinery, 7 pages, Mar. 5, 2011.

Sano, et al., "Segment-Parallel Predictor for FPGA-based Hardware Compressors and Decompressors of Floating-Point Data Streams to Enhance Memory I/O Bandwidth," 2010 Data Compression Conference, Mar. 2010, IEEE, pp. 416-425.

* cited by examiner

COMPRESSION AND DECOMPRESSION OF NUMERICAL DATA

RELATED APPLICATION

This application is a continuation of U.S. application Ser. No. 13/101,574, filed May 5, 2011, now U.S. Pat. No. 8,368,568, issued Feb. 5, 2013, which claims priority under 35 U.S.C. §119 or 365 to European Application No. 10305502.6, filed May 11, 2010.

The entire teachings of the above application(s) are incorporated herein by reference.

FIELD OF THE INVENTION

The invention relates to the field of computer programs and systems, and more specifically to a computer-implemented method for compressing and decompressing numerical data.

BACKGROUND OF THE INVENTION

Computer-aided techniques are known to include Computer-Aided Design or CAD, which relates to software solutions for authoring product design. Similarly, CAE is an acronym for Computer-Aided Engineering, e.g. it relates to software solutions for simulating the physical behavior of a future product. CAM stands for Computer-Aided Manufacturing and typically includes software solutions for defining manufacturing processes and operations.

In computer-aided techniques, the graphical user interface (GUI) plays an important role as regards the efficiency of the technique. Most of the operations required for manipulating and/or navigating the modeled objects may be performed by the user (e.g. the designers) on the GUI. Especially, the user may create, modify, and delete the modeled objects forming the product, and also explore the product so as to comprehend how modeled objects are interrelated, e.g. via a product structure. Traditionally, these operations are carried out through dedicated menus and icons which are located on the sides of the GUI. Recently, CAD systems such as CATIA allow calling these functions nearby the representation of the product. The designer does not need anymore to move the mouse towards menus and icons. Operations are thus available within reach of the mouse. In addition, the operations behave semantically: for a given operation selected by the designer, the CAD system may suggests to the designer, still nearby the mouse, a set of new operations according to the former selected operation that the designer is likely to select.

Also known are Product Lifecycle Management (PLM) solutions, which refer to a business strategy that helps companies to share product data, apply common processes, and leverage corporate knowledge for the development of products from conception to the end of their life, across the concept of extended enterprise. By including the actors (company departments, business partners, suppliers, Original Equipment Manufacturers (OEM), and customers), PLM may allow this network to operate as a single entity to conceptualize, design, build, and support products and processes.

Some PLM solutions make it for instance possible to design and develop products by creating digital mockups (a 3D graphical model of a product). The digital product may be first defined and simulated using an appropriate application. Then, the lean digital manufacturing processes may be defined and modeled.

The PLM solutions provided by Dassault Systemes (under the trademarks CATIA, ENOVIA and DELMIA) provides an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Such PLM solutions comprise a relational database of products. The database comprises a set of textual data and relations between the data. Data typically include technical data related to the products said data being ordered in a hierarchy of data and are indexed to be searchable. The data are representative of the modeled objects, which are often modeled products and processes.

Product lifecycle information, including product configuration, process knowledge and resources information are typically intended to be edited in a collaborative way.

A number of systems and programs are thus offered on the market for the design of objects (or parts) or assemblies of objects, forming a product, such as the one provided by Dassault Systemes under the trademark CATIA.

These CAD systems allow a user to construct and manipulate complex three dimensional (3D) models, or two dimensional (2D) models, of objects or assemblies of objects. CAD systems thus provide a representation of modeled objects using edges or lines, in certain cases with faces. Lines or edges may be represented in various manners, e.g. non-uniform rational B-splines (NURBS). These CAD systems manage parts or assemblies of parts as modeled objects, which are mostly specifications of geometry. Specifically, CAD files contain specifications, from which geometry is generated, which in turn allow for a representation to be generated. Geometry and representation may be stored in a single CAD file or multiple ones. CAD systems include graphic tools for representing the modeled objects to the designers; these tools are dedicated to the display of complex objects—the typical size of a file representing an object in a CAD system being in the range of one Megabyte per part, and an assembly may comprise thousands of parts. A CAD system manages models of objects, which are stored in electronic files.

2D or 3D models created by a user with CAD software thus contain geometric objects such as points, vectors, curves, surfaces and meshes. These objects are usually represented with floating-point values as well as other data types.

A floating point value is a value of a data type used to represent a number which belongs to the real numbers (in the mathematical sense). One of the most widely used standard format for floating point values is the double-precision floating point defined in the IEEE 754 format standard, more particularly the IEEE 754-1985. In this format, a floating point value a representing real number $\tilde{a}$ is defined by a sign, an exponent and a mantissa on 64 bits. If a is a 64-bit floating point value in the IEEE 754 standard, we can write a=(s, e, m) with the following components: the sign s (integer coded on 1 bit), the exponent e (integer coded on 11 bits), and the mantissa m (integer coded on 52 bits). Then, by definition of the standard, if $0<e<2^{11}-1$, a is said to be normalized and represents the real number $$\tilde{a} = (-1)^s * 2^{e\text{-bias}} * \left(1 + \frac{m}{2^{52}}\right) \text{ with bias} = 2^{11-1} - 1 = 1023.$$

If e=0 and m=0, then a is said to be a zero and represents the real number ã=0. If e=0 and m is different from 0, then a is said to be denormalized and represents the real number $$\tilde{a} = (-1)^s * 2^{1-bias} * \frac{m}{2^{52}} \text{ with bias} = 2^{11-1} - 1 = 1023.$$

If $e=2^{11}-1$, then a is said to be invalid and does not represent any number.

A basic functionality provided by a CAD software is the ability to store on a persistent support the models created or modified by the user during a first session, and to allow these models to be reopened later for further use (e.g. in a file on the local disk, or on a server). The models can for instance be opened later in a second session of the same software, albeit with a different version of this software or on another platform. The platforms can differ in terms of hardware (different CPU) or in terms of software (different language compiler or interpreter). The model in the second session after opening should be exactly the same as the model in the first session before storing. Therefore, the storing must be lossless (i.e. involve no loss of information) and stable across different platforms (i.e. such that the opening of the model provides the same result on different platforms which support the data types used to define the model).

Stability issues appear when the storing and the reopening of the model involve transforming the data stored to define the model (e.g. by compressing and decompressing the data), particularly if the transformation of the model involves arithmetic operations. Indeed, different platforms provide different results for the same operations depending on the data type. For example, if a, b and c are floating point values, then some platforms will compute the operation a+b+c as (a+b)+c while some other platforms will compute the same operation as a+(b+c), which will not necessarily lead to the same result. Moreover, floating point arithmetic involves intermediaries to perform the computations. These intermediaries do not have the same bit length on different platforms, which leads to different results. Thus, the same floating point operations performed on different platforms can lead to different results although the operations are performed on the same data. The document "What every scientist should know about floating point arithmetic", ACM Computing Surveys, Vol. 23, No 1, March 1991, by David Goldberg, presents issues related to operations on floating point values. In the following, stability will be said to be ensured for an operation (or a series of operations) if the operation(s) leads (lead) to the same result on any regular platform.

Models can be stored on the persistent support in a straightforward implementation, i.e. without compression. In this implementation, the floating point values and other data defining a given geometric object are stored as such. This straightforward method (i.e. without compression) is notably used in CATIA and in other CAD software. With such a method, the storing is lossless. Indeed, the data defining the model is not modified before storing, and there can therefore not be any loss of data. The storing is also stable. Indeed, the data defining the model is not to be transformed when the model is reopened, because the data is not compressed. However, such a method fails to optimize the storage size of a CAD model.

In the field of data compression in general, delta-encoding is a way of compressing data that represents a target object by storing the difference between the target object and a known reference object, instead of the target object itself. This is advantageous if the difference can be stored in less space than the target object.

Predictive encoding is a variant of delta-encoding where the reference is not an actual object taken among the data but is computed from one or several actual objects using a predictor function. Thus, the predictor function predicts a reference object from actual objects. Instead of storing the target object as such (i.e. without compression), the difference between the predicted reference object and the target object is stored. The closer the prediction is to the current object, the smaller the difference is, and therefore the less storage space it takes to store the difference. The efficiency of the compression thus depends on the accuracy of the prediction.

Quantization is another compression technique. Quantization is used for the compression of data comprising floating point values, possibly in combination with delta-encoding or predictive encoding. Quantization is the process of mapping floating point values to integers. Quantization produces a loss of data as it involves truncating the least significant bits of some floating point values.

The article "Higher Bandwith X" (1994) and the Ph.D. Thesis "Compressing the X Graphics Protocol" (1995) by John Danskin describe a way of compressing geometry using "relative coordinates", which is a form of delta-encoding. However the geometry is defined with integer coordinates. The method is therefore inappropriate for CAD models of which geometry are defined with a higher level of precision.

The article "Geometry Compression" (1995) by Michael Deering describes the compression of triangular mesh using quantization of floating-point numbers and delta-encoding between neighbors. The article "Triangle Mesh Compression" (1998) by Costa Touma and Craig Gotsman also describes the compression of triangular mesh, but using quantization and predictive encoding. The articles "Geometric Compression Through Topological Surgery" (1998) by Gabriel Taubin and Jarek Rossignac and "Compressing Polygon Mesh Geometry with Parallelogram Prediction." (2002) by Martin Isenburg and Pierre Alliez describe a similar approach with a different prediction scheme. The prediction is computed by a linear combination of other points in the mesh. All these methods notably present the shortcoming of producing a lossy compression because of quantization.

The article "Out-of-core Compression and Decompression of Large n-dimensional Scalar Fields" (2003) by L. Ibarria et al. describes a prediction encoding method for floating point data. The prediction function involves floating point arithmetic computation and has thus the shortfall that stability is not guaranteed across different platforms. Indeed, as mentioned above, floating point arithmetic computations do not produce the same result on different platforms.

The article "Lossless Compression of Floating-Point Geometry" (2004) by Isenburg et al. describes a prediction encoding method for floating point data. As above, stability is not guaranteed across different platforms.

U.S. Pat. No. 5,793,371, U.S. Pat. No. 5,825,369, U.S. Pat. No. 5,842,004, U.S. Pat. No. 5,867,167, U.S. Pat. No. 5,870,094, U.S. Pat. No. 5,905,502, U.S. Pat. No. 5,905,507, U.S. Pat. No. 5,933,153, U.S. Pat. No. 6,047,088, U.S. Pat. No. 6,167,159, U.S. Pat. No. 6,215,500, U.S. Pat. No. 6,239,805, U.S. Pat. No. 6,522,327, U.S. Pat. No. 6,525,722, and U.S. Pat. No. 6,532,012 describe similar methods and none of these documents addresses the issue of stability.

The article "Lossless Compression of High-volume Numerical Data from Simulations" (2000) by Engelson et al. describes compression of floating point values. The values do not represent geometric objects, but rather are a sequence of values that changes smoothly and are parameterized by a given variable. The article provides an example of a sequence of three values $(a_1, a_2, a_3)$ which is a linear growing sequence (i.e. $a_3-a_2 \approx a_2-a_1$). A simple prediction encoding scheme for this sequence would be to take $a^p_3=a_2+a_2-a_1$ as the prediction for $a_3$. The difference between the predicted value and actual value is $\Delta^2 a_3=a_3-a^p_3=(a_3-a_2)-(a_2-a_1)$. As the sequence is linear, the prediction is good and $\Delta^2 a_3$ is small: $(a_1, a_2, \Delta^2 a_3)$ can be stored, which takes less storage size than the original sequence. A problem, noted by the article, is that the computation of the prediction involves floating point arithmetic operations, which prevents stability on different platforms. The article thus introduces the notion of the integer representation of a floating-point number. If p is a floating-point 64-bit number, its integer representation Int(p) is defined as an integer that is represented by the same 64-bit string asp. The integer representations are defined as $b_1=Int(a_1)$, $b_2=Int(a_2)$, $b_3=Int(a_3)$. The compression then applies the prediction-encoding described above on the sequence $(b_1, b_2, b_3)$ and stores $(b_1, b_2, \Delta^2 b_3)$ with $\Delta^2 b_3=(b_3-b_2)-(b_2-b_1)$. With the aim of guaranteeing stability, the document thus suggests performing the following steps: converting m consecutive floating point values into their integer representations and computing a sequence of classical integer subtractions on these integer representations.

However with some numerical values, the method of Engelson et al. is totally inefficient. For example, using the notations of the document, the sequence of floating point values $(a_1=1.5, a_2=2.0, a_3=2.5)$ is considered (the floating point values are here referred to by the real number that they represent). This sequence is linear and the prediction-encoding scheme described above should theoretically be applied very efficiently on these floating point numbers, using floating point arithmetic, because the difference $\Delta^2 a_3$ is exactly 0. If one however applies the method of the article, then $\Delta^2 b_3 = (b_3-b_2)-(b_2-b_1)$ has 51 significant bits. This is due to the fact that the integer difference between the integer representations of two floating point values does not only depend on the floating point difference between the two floating point values but also on the values of the two floating points themselves. In the above example, $b_3-b_2$ is different from $b_2-b_1$ because the floating point representations of 2.5 and 2.0 have the same exponent but the floating point representation of 1.5 does not have the same exponent. The efficiency of the compression is therefore not satisfying. Thus, a first shortfall of this method is that it does not work well enough (i.e. the compression rate is not high enough) on some types of sequences. The article further states: "The fixed step difference algorithm works well if the sequence Int(a) can be approximated by polynomials". In real applications, however, it would be better to assume that a can be approximated by polynomials. Thus in real applications the method of performing integer difference on the sequence Int(a) would lead to bad predictions.

Another shortfall is that the computation of $\Delta$ can only use subtraction, not other operations. For example the multiplication and division cannot be applied to the integer representations. In other words, the difference between the integer representation of two floating point numbers may be representative of the difference between, the two floating point numbers on some cases (with at least the exception described earlier), but the multiplication (or division, or addition) of the integer representations is not representative of the multiplication (or division, or addition) between the two floating point numbers. For the addition for example, this is notably because the exponents of the two floating point values transformed in their integer representation would be added. This severely limits the prediction schemes that can be used. Thus, the prediction accomplished is not as accurate as possible and the compression rate is impacted.

The article "Fast Lossless Compression of Scientific Floating-Point Data" (2006) by Ratanaworabhan et al. and the article "Fast and Efficient Compression of Floating-Point Data" (2006) by Peter Lindstrom and Martin Isenburg describe similar techniques with the same shortfalls.

It is an aim of the invention to provide a method which is suitable to efficiently reduce the storage size of a CAD file. Such a solution would reduce the cost of the storage infrastructure and increase the speed of sending or receiving CAD models over a network.

SUMMARY OF THE INVENTION

This aim is achieved with a computer-implemented method for compressing numerical data comprising a structured set of floating point actual values, a floating point value being defined by a sign, an exponent and a mantissa, the method comprising computing a floating point predicted value related to a target actual value of the set, the computing including performing operations on integers corresponding to the sign, to the exponent and/or to the mantissa of actual values of a subset of the set; storing a bit sequence representative of a difference between integers derived from the target actual value and the predicted value.

Preferred embodiments may comprise one or more of the following features:

The steps of computing and storing are iterated according to an order of the set;

At least one beginning actual value of the set is stored and the step of computing is iterated over all the other actual values of the set, and, at each iteration, is followed by steps of comparing the computed predicted value of the iteration to a threshold, storing: a bit sequence representative of a difference between integers derived from the target actual value of the iteration and the predicted value of the iteration, when the predicted value is higher than the threshold, or the target actual value of the iteration, when the predicted value of the iteration is lower than the threshold;

The actual values of the set are coordinates associated to a geometric object, preferably coordinates of control points of the geometric object;

The actual values of the subset are coordinates of control points of the geometric object neighboring another control point of the geometric object, the target actual value being a coordinate of said another control point;

The predicted value is determined according to at least one parameter associated to said another control point, the actual values of the subset, and at least one parameter associated to each control point neighboring said another control point;

The at least one parameters are determined according to a respective knot vector of the geometric object;

The geometric object is a NURBS surface and the at least one parameters are the Gréville parameters;

The integers derived from the target actual value and the predicted value are the integers defined by the strings which respectively define the target actual value and the predicted value;

The bit sequence representative of the difference comprises a prefix bit sequence indicative of a number of significant bits, and a body bit sequence equal to the difference to which the leading zeros, and preferably the first bit equal to one, are cut and of which size is the number of significant bits;

The operations comprise arithmetic operations including integer addition, subtraction, multiplication and/or division and/or bitwise operations including bits shifts and/or leading zero count.

This aim is also achieved with a computer-implemented method for decompressing numerical data, which may be compressed according to the above method, the method generally comprising: computing a floating point predicted value, the computing including performing operations on integers corresponding to the sign, the exponent and/or the mantissa of the actual values of a set, and deriving a floating point actual value from the addition of a bit sequence with an integer derived from the predicted value.

The decompressing method may thus be for decompressing numerical data, wherein the numerical data are a compressed form of data comprising a structured set of floating point actual values, a floating point value being defined by a sign, an exponent and a mantissa, and wherein the numerical data include a bit sequence representative of a difference between integers derived from a target actual value of the set and a floating point predicted value related to the target value. The method then comprises computing the predicted value, the computing including performing operations on integers corresponding to the sign, the exponent and/or the mantissa of actual values of a subset of the set, and deriving the target actual value from the addition of the bit sequence with an integer derived from the predicted value.

In embodiments, the decompressing method may comprise any or a combination of the following features:

The steps of computing and deriving are iterated according to an order of the set;

At each iteration, the subset comprises target values derived at former iterations and/or target values included in the numerical data as such;

The numerical data further include at least one beginning actual value (stored as such) of the set and the step of computing is iterated over all the other actual values of the set, and, at each iteration, the step of computing is followed by a step of comparing the computed predicted value of the iteration to a threshold, and a step of: deriving the target actual value from the addition of a bit sequence (included in the numerical data) with an integer derived from the predicted value (as above), when the predicted value is higher than the threshold, or retrieving a target actual value (included as such in the numerical data), when the predicted value of the iteration is lower than the threshold;

The actual values of the set are coordinates associated to a geometric object, preferably coordinates of control points of the geometric object;

The actual values of the subset are coordinates of control points of the geometric object neighboring another control point of the geometric object, the target actual value being a coordinate of said another control point;

The predicted value is determined according to at least one parameter associated to said another control point, the actual values of the subset, and at least one parameter associated to each control point neighboring said another control point;

The at least one parameters are determined according to a respective knot vector of the geometric object;

The geometric object is a NURBS surface and the at least one parameters are the Gréville parameters;

The integers derived from the target actual value and the predicted value are the integers defined by the strings which respectively define the target actual value and the predicted value;

The bit sequence representative of the difference comprises a prefix bit sequence indicative of a number of significant bits, and a body bit sequence equal to the difference to which the leading zeros, and preferably the first bit equal to one, are cut and of which size is the number of significant bits;

The operations comprise arithmetic operations including integer addition, subtraction, multiplication and/or division and/or bitwise operations including bits shifts and/or leading zero count.

This aim is also achieved with a computer-aided design system comprising: a database storing an object modeled by numerical data comprising a structured set of floating point actual values, a graphical user interface, and means for compressing numerical data according to the above compression method and/or decompressing numerical data according to the above decompression method.

This aim is also achieved with a computer program comprising instructions for execution by a computer, the instructions comprising means for performing any of the above methods.

This aim is also achieved with a computer readable storage medium having recorded thereon the above computer program.

Further features and advantages of the invention will appear from the following description of embodiments of the invention, given as non-limiting examples, with reference to the accompanying drawings listed hereunder.

DETAILED DESCRIPTION OF THE INVENTION

Figure 1:
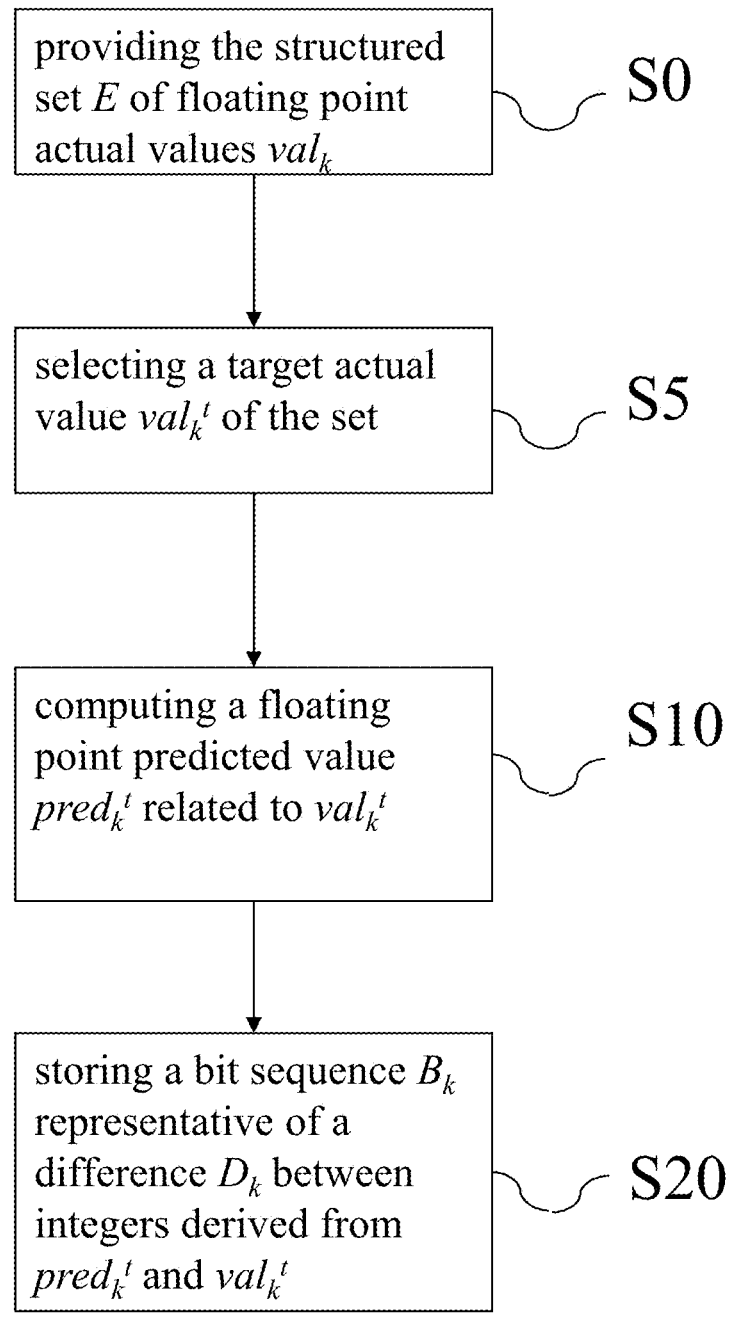
FIGS. 1-4 show flowcharts of examples of a compression method.

The invention is related to a computer-implemented method for processing data.

More specifically, the invention is related to a computer-implemented method for compressing numerical data which comprise a structured set of floating point actual values. The method includes computing a floating point predicted value related to a target actual value of the set. The computing includes performing operations on integers. The integers correspond to the sign, to the exponent and/or to the mantissa of actual values of a subset of the set. The method also comprises storing a bit sequence representative of a difference between integers, the said integers being derived from the target actual value and the predicted value. Such a computer-implemented method allows an efficient compression of numerical data which comprises a structured set of floating point actual values, the compression being lossless and stable across different platforms supporting the floating point data type. Such a method is suitable to efficiently reduce the storage size of a file which contains numerical data which comprise a structured set of floating point actual values.

Because it is lossless and stable across different platforms, the method can be applied in particular to a CAD file containing specifications of a 2D or 3D CAD model. Indeed, CAD models are specified by numerical data which comprise a structured set of floating point actual values. The method can thus efficiently compress such a CAD file, thereby reducing the storage size of the CAD file. By "efficiently" compress a file, it is meant the compression rate is statistically higher than 20%. A compression method is said to be more efficient to another if it statistically accomplishes a higher compression rate. The method can thus reduce the cost of the storage infrastructure and increase the speed of sending or receiving CAD models over a network.

The method is however directed to the compression of numerical data in general. In other words, the method reduces the storage size of numerical data, thus enables to reduce the size of any file containing such data. The data is numerical, which means that it relates to numbers. More specifically, the method may be applied to compress any numerical data which comprise a structured set of actual floating point actual values.

The floating point values may be of the data type defined by the IEEE 754 format standard. The method is however directed to other similar data types. For example, floating point values may be coded on fewer or more bits than the 64 bits of the standard. The floating point values may be of data types of a different structure, for example an exponent, a mantissa and no sign. More generally, the method applies to any numerical data type which is represented by at least two integers. However, for the sake of clarity, in the following the floating point values are considered of the IEEE 754 type.

The set of actual floating point values is structured. By "structured", it is meant that the set of numbers represented by the actual floating point values is coherent, i.e. the numbers are not completely independent from each other. This coherence is reflected on the actual floating point values of the set, which are also not completely independent from each other either. Thanks to the set being structured, the value of each of the actual floating point values of the set may be predicted from other actual floating point values of the set. The structure may depend on a kind of an object represented by the numerical data. In this case, the prediction may be performed according to a prediction scheme (possibly predetermined or selected once and for all in a first step of the method). The prediction scheme may depend on the kind of the object represented by the numerical data. Owing to the fact that, by definition, objects of a same kind are structured in a same way, the method is in this case suitable for compressing numerical data representing any object of a given kind with the same prediction scheme.

An example of application of the method is on an object which is the price of a stock over time. The set of actual floating point values may represents the values of price over a time series. It is well known that the price of the stock at a time is not completely independent from the price at other times. Financial quantitative analysis use different prediction schemes e.g. based on the Brownian motion to make predictions. The same prediction scheme may be used for different stocks. Another example involves sets of actual floating point values representing the temperature of cities. Again in this case, a geographical proximity between two cities may involve a dependency between their temperatures. Thus, the floating point value representing the temperature of a city may be predicted from the floating point values representing the temperature of neighboring cities. Another example involves a force field applied to an object. The force field is represented by a set of actual floating point values, which is structured when the forces applied to the object present a spatial coherence. For example, a magnetic field generally induces a force field which presents such coherence. Another example which will be discussed in more details later is a geometric surface of a CAD model. Such a surface generally varies smoothly and the position of a point of the surface may thus be predicted according to the position of neighboring points of the surface.

The method makes use of the structure of the set of floating point actual values (which structure derives from the structure of the numbers represented by the floating point values) in order to compress the numerical data. The principle is, as in predictive encoding, to first select one of the actual floating point values of the set. This value is called the "target" value because it is the value to be transformed by the method for compression. The method then computes a floating point predicted value related to the target actual value. In other words, the method computes a predicted value which is a prediction of the target, and not necessarily the actual value of the target. The computation is performed according to other actual values of the set and makes abstraction of the actual value of the target. The predicted value is itself of the floating point data type.

Because the set is structured and the prediction scheme is according to this structure, the computation of a predicted value performed according to other values of the set provides a result relatively close to the actual value of the target. Thus, the difference between the predicted value and the target actual value can be coded on few bits. This idea is the one usually followed by predictive encoding.

The prediction scheme may include the selection of a subset of the set, the floating point values of the subset being the basis of the computation of the predicted value. The subset may be selected according to the target value. The values of the subset represent numbers which are theoretically relevant for the prediction of the number which is represented by the target floating point value. The way to perform this selection may be provided by the kind of the object represented by the numerical data.

The computing of the predicted value includes performing operations on integers. Because the operations are not performed on floating point values, there is no stability issue. Indeed, regular platforms perform integer operations with the same result (as opposed to operations on floating point values). The method is thus stable across all regular platforms as it solely performs operations on integers.

The integers correspond to the sign, to the exponent and/or to the mantissa of actual values of a subset of the set. The subset comprises the actual values which are used to compute the predicted value of the target actual value. The method reads, at least for the actual values used for the prediction, the bit slots reserved for the sign, for the exponent and/or for the mantissa and interprets what is read as an integer. Any way of interpretation is within the scope of the method. For example, the method may interpret the mantissa coded on 52 bits as a 64-bits integer. The integer corresponding to the mantissa may for example be a 64-bits integer whose first 12 bits are equal to 0 and whose last 52 bits are the bits of the mantissa. Inversely, the integer corresponding to the mantissa may for example be a 64-bits integer whose last 12 bits are equal to 0 and whose first 52 bits are the bits of the mantissa. Longer integers may also be used. In general, the interpretation of the sign, the exponent and/or the mantissa depends on next steps of the prediction scheme (i.e. the sequence of operations performed to compute the predicted value) and on the precision required.

As the integers correspond to the sign, the exponent and/or the mantissa of actual values of the subset, the prediction scheme takes advantage of the floating point form of the actual values. Indeed, the operations are performed on representatives of the sign, of the exponent and/or of the mantissa considered individually, instead of roughly determining one integer representative per floating point value without any consideration of the characteristics of the floating point, as in the method of Engelson et al. discussed above. Notably, operations different from integer subtraction may also be performed. For example, integer addition, multiplication, division performed on the sign, the exponent and/or the mantissa make sense. The prediction is thus refined and is more accurate. A more accurate prediction leads to a higher compression rate. Examples showing how the prediction is refined are provided later.

As mentioned above, the method then comprises storing a bit sequence representative of a difference between integers, the said integers being derived from the target actual value and the predicted value. Because the set is structured, the prediction generally leads to a predicted value close to the target actual value. In this case, the difference between integers derived from the target actual value and the predicted value is small. The difference can thus be stored on a bit sequence of smaller size than the size of the target actual value. Thus, instead of storing the target actual value as such, a bit sequence of smaller size is stored. The bit sequence can then be used in a decompression step to retrieve the target actual value. Because the bit sequence is representative of a difference which is performed between integers, the stability and the lossless qualities of the compression remain. Indeed, the difference between two integers leads to the same result on all regular platforms without any loss of information. The derivation of the integers from the target actual value and the predicted value is detailed later.

The above explanations concerned the general case of application of the method. Referring to FIG. 1, the general case includes a single application of the steps of computing S10 a predicted value $pred_k^t$ and of storing S20 the bit sequence $B_k$. As shown on the example of FIG. 1, the method may also include a step of providing S0 a structured set E of floating point actual values $val_k$ and a step S5 of selecting a target actual value $val_k^t$ of the set to which the predicted value $pred_k^t$ to be computed relates, before the step of computing S10.

Figure 2:
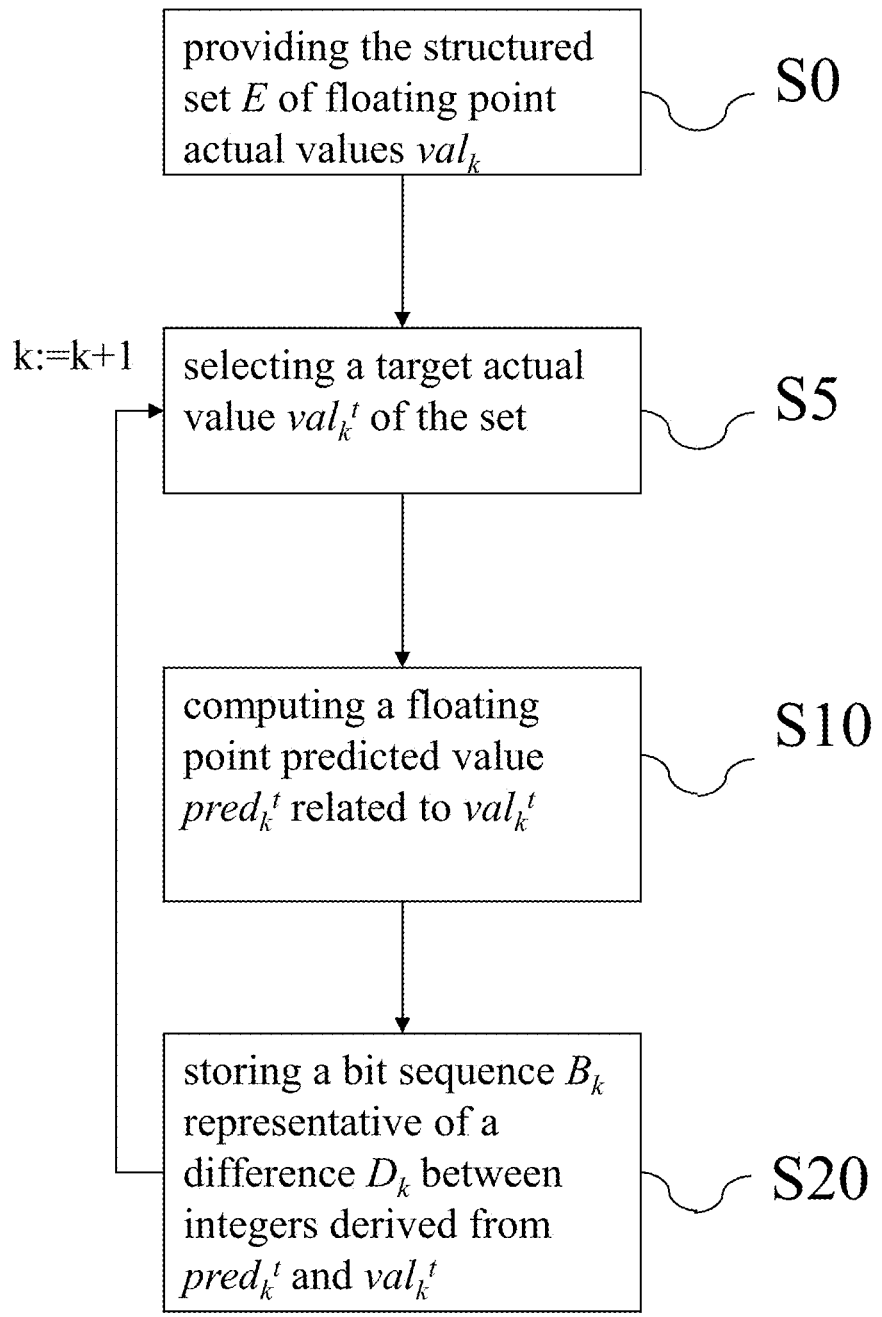

The steps of computing S10 and storing S20 are preferably iterated (i.e. repeated), as exemplified in FIG. 2. At each iteration (i.e. repetition) k, the target value $val_k^t$ is a new selected actual value of the set E, which has not been the target value of one of previous iterations of the method. Such iteration is performed according to an order (0, . . . , k−1, k, k+1, . . . ) of the set E. The set is thus browsed (i.e. parsed) according to the order, and at each iteration k of the browsing, the selection S5 of the target value follows the order and the value $val_k$ numbered k is selected. The order may be predetermined. For example, the numerical data may comprise information regarding the order. The order may alternatively be arbitrarily determined at the start before performing the iterations. It may also be dynamically iterated during the iteration. Such a method statistically allows the global compression of the numerical data.

Figure 3:
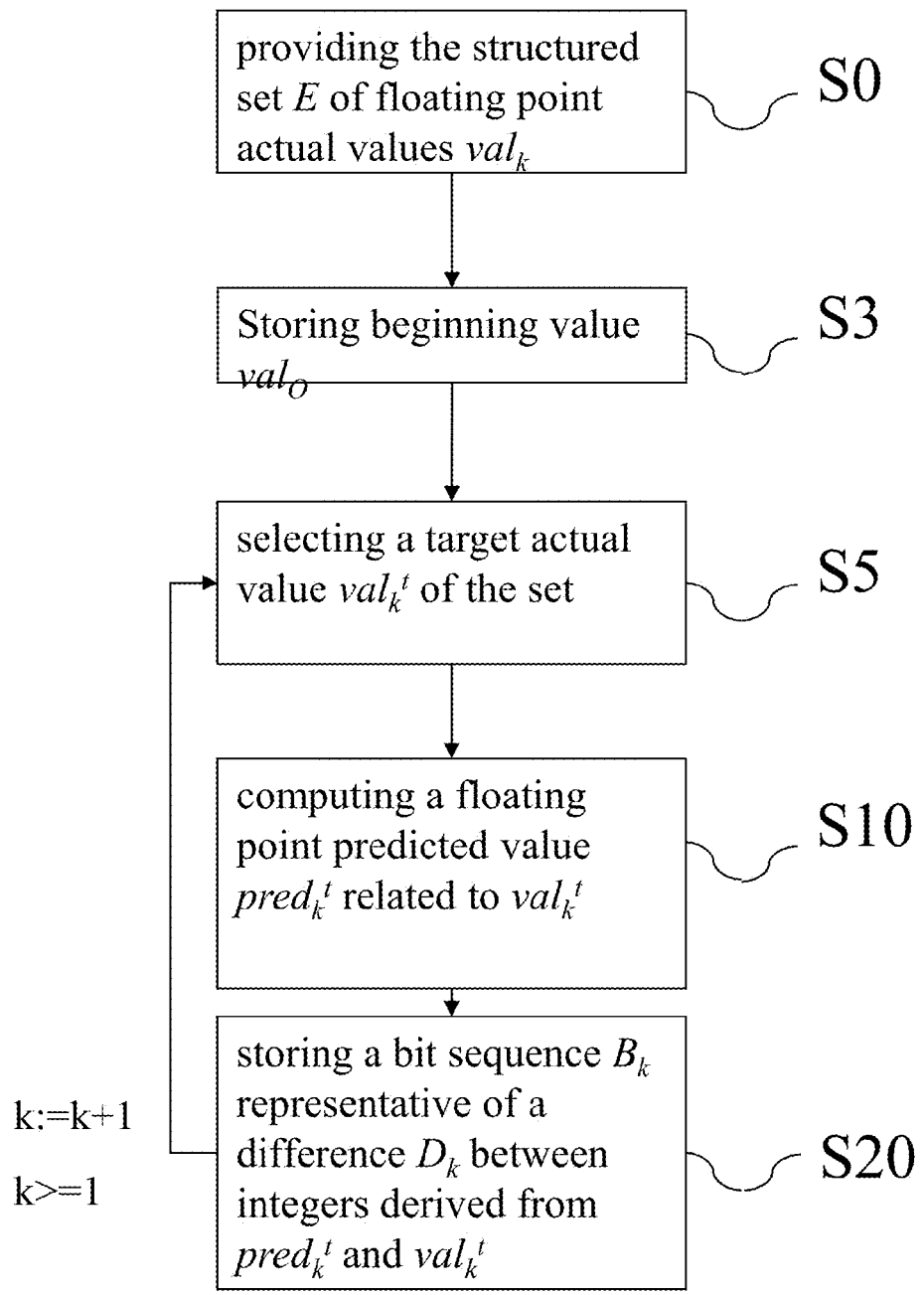

As exemplified on FIG. 3, the method may store S3 at least one beginning actual value $val_0$ of the set, for example one value $val_0$, two values ($val_0$ and $val_1$), or three values ($val_0$, $val_1$ and $val_2$) or more, and the step of computing S10 may be iterated over all the other actual values of the set. For example, if one beginning value $val_0$ is stored in S3 and the set E has n values, then the step of computing S10 may be iterated on remaining values $val_1$, $val_2$, . . . , $val_n$. Alternatively, some of the remaining values may be skipped (this is however equivalent to redefining the set to the values on which the step of computing S10 is performed). The step of storing S20 may itself be performed on all or some values on which the step of computing 10 has been performed. A beginning value is thus a value which is stored as such (i.e. uncompressed). Thus, a beginning value is not a target of an iteration k subjected to the computing S10 and storing S20 steps. When decompressing, as will be seen later, the prediction may be performed based on actual values of the subset. Thus, at least some values may be stored as such to allow the start of the decompression. Alternatively, the first predictions for actual values may be performed based on a stored means of actual values. Alternatively, the first predictions may be performed according to other parameters comprised in the numerical data.

Figure 4:
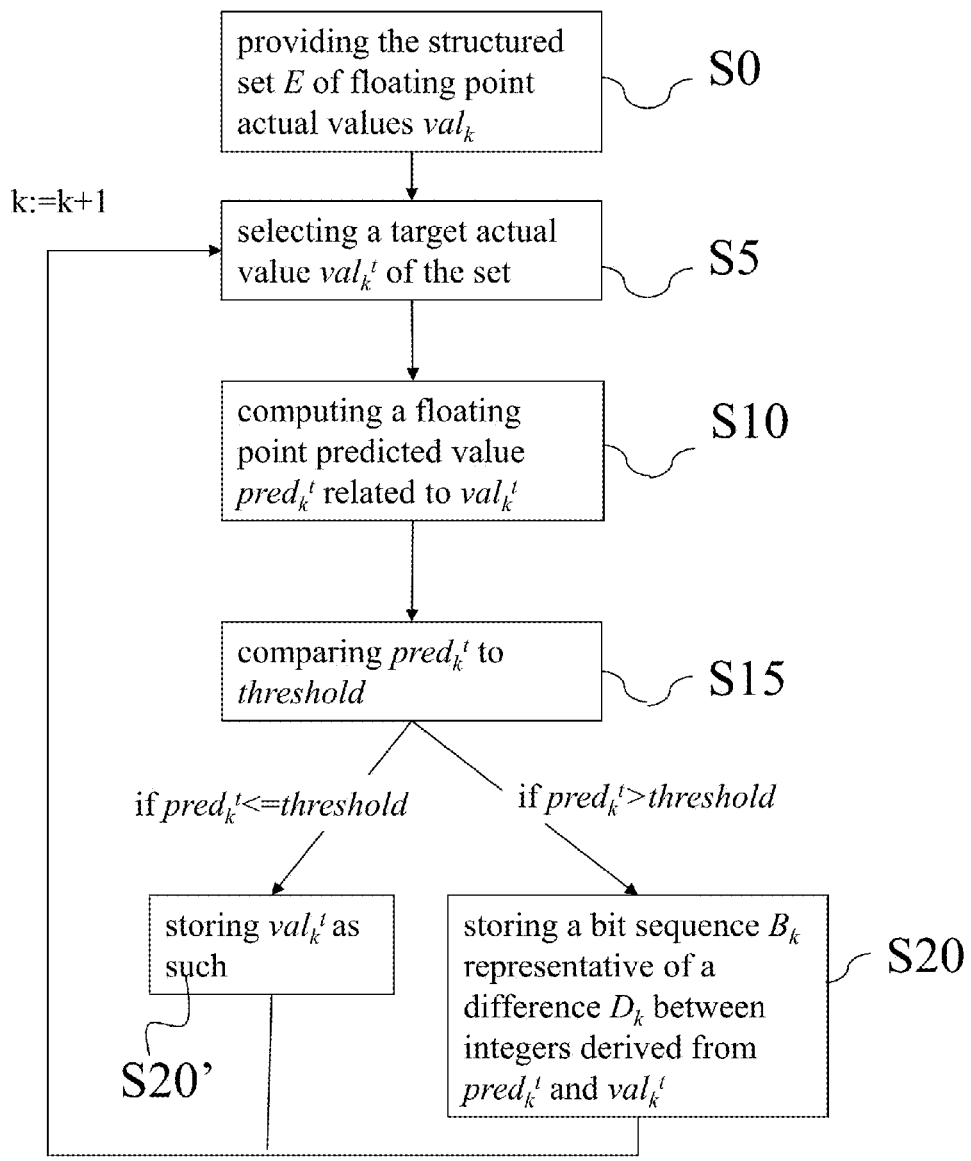

At each iteration k, the step of computing S10 may be followed by a step of comparing S15 the computed predicted value $pred_k^t$ of the iteration k to a threshold, as exemplified on FIG. 4. In this case, at a following step of storing, what is stored depends on the result of the comparison. The method either stores in a step S20 and as described earlier a bit sequence representative $B_k$ of a difference $D_k$ between integers derived from the target actual value $val_k^t$ of the iteration and the predicted value $pred_k^t$ of the iteration k, when the predicted value $pred_k^t$ is higher than the threshold. Or the method stores in a step S20' the target actual value $val_k^t$ of the iteration, uncompressed, when the predicted value of the iteration is lower than the threshold.

At each computing step S10, the predicted value $pred_k^t$ is computed in a way to be as close as possible to the target actual value $val_k^t$. However in many contexts it can be estimated a priori that the difference between $pred_k^t$ and $val_k^t$ has a high probability of being too big to be compressed effectively. If the predicted value $pred_k^t$ is smaller than a given threshold, then there is a risk that the difference between $pred_k^t$ and $val_k^t$ is higher than $pred_k^t$, thus leading to a bit sequence $B_k$ representative of the difference between integers derived from $pred_k^t$ and $val_k^t$ that is higher than the number of bits used to code $val_k^t$ as such. For example, if the predicted value $pred_k^t$ is close to 0, there is a risk that the actual $val_k^t$ is of a different sign from the predicted value $pred_k^t$, in which case the bit sequence $B_k$ is too long. This will appear even more clearly when examples of such bit sequences $B_k$ are provided. To avoid a probable and unwanted increase in encoding space, if the prediction is smaller than the threshold the number $val_k^t$ itself, no attempt of compression is made. Furthermore, the overall process speed is increased as the bit sequence $B_k$ is not determined.

The threshold value may be a threshold on the value of the exponent of the predicted value $pred_k^t$. In other words, the exponent of $pred_k^t$ is compared to the threshold. Such a threshold ensures the quickness of the step of comparison S15. Such a threshold may be predetermined and may depend on the context of application. The threshold may alternatively be determined according to the numerical data and stored in order to be reused during the decompression. The value of the threshold may take into account the rounding precision of the arithmetic operations used to compute S10 the predicted value $pred_k^t$. The threshold may also be determined dynamically according to predicted values ($pred_{k-1}^t$, $pred_{k-2}^t$, . . . ) previously computed and/or related actual values ($val_{k-1}$, $val_{k-2}^t$, . . . ). The threshold of an iteration k typically does not depend on $val_k^t$ or $pred_k^t$. The comparison with a threshold renders the compression more efficient by processing the case of actual values of which predicted values have a high probability of leading to bad compression rate.

The step of storing S3 at least one beginning actual value of the set is not represented on FIG. 4, but may be comprised in the method after the step of providing S0 the structured set E of floating point actual values $val_k$ as on FIG. 3.

The actual values of the set may be coordinates associated to a geometric object, for example coordinates of control points of the geometric object. Numerical data comprising floating point coordinates of geometric objects make up for a high proportion of CAD files. The method is thus particularly suitable to the compression of CAD files. In an example, the geometric object is a NURBS surface. In other examples, the geometric object is a curve, e.g. a NURBS curve, or another type of curve or surface. The method applies to any geometric object in general. Examples of the method are detailed in the following with reference to NURBS, for the sake of clarity. But it must be understood that the following explanations apply to other uses of the method.

A NURBS surface is a surface, widely used in CAD, defined in a 2D space with values in a 3D space: S(u, v)→(x, y, z). A NURBS surface is represented with two knot vectors and a 2-dimensional array of control points, and possibly other data depending on the CAD software used. Typically, the knot vectors are arrays of floating point values. The array of control points may be ordered. Each control point is a 3D point with coordinates x, y, z. The place in the array is defined with the two indices i and j; with 0≤i<M and 0≤j<N. A set of parameters known as the Gréville parameters can be computed from the knot vectors so that each value of the indices i or j can be associated to a Gréville parameter ($u_i$, $v_j$). Traditionally, the Gréville parameters are a couple of means of a fixed number of consecutive values of the knot vector. This fixed number, called "degree", may be different for each dimension (u or v) of the knot vector. In general, a couple of degrees (d, g) belong to the data representing the NURBS surface. For more details, the article "Curves and surfaces for Computer Aided Geometric Design", ed. Morgan Kaufmann, (2001) by Gerald Farin provides the basics of NURBS surfaces.

Figure 5:
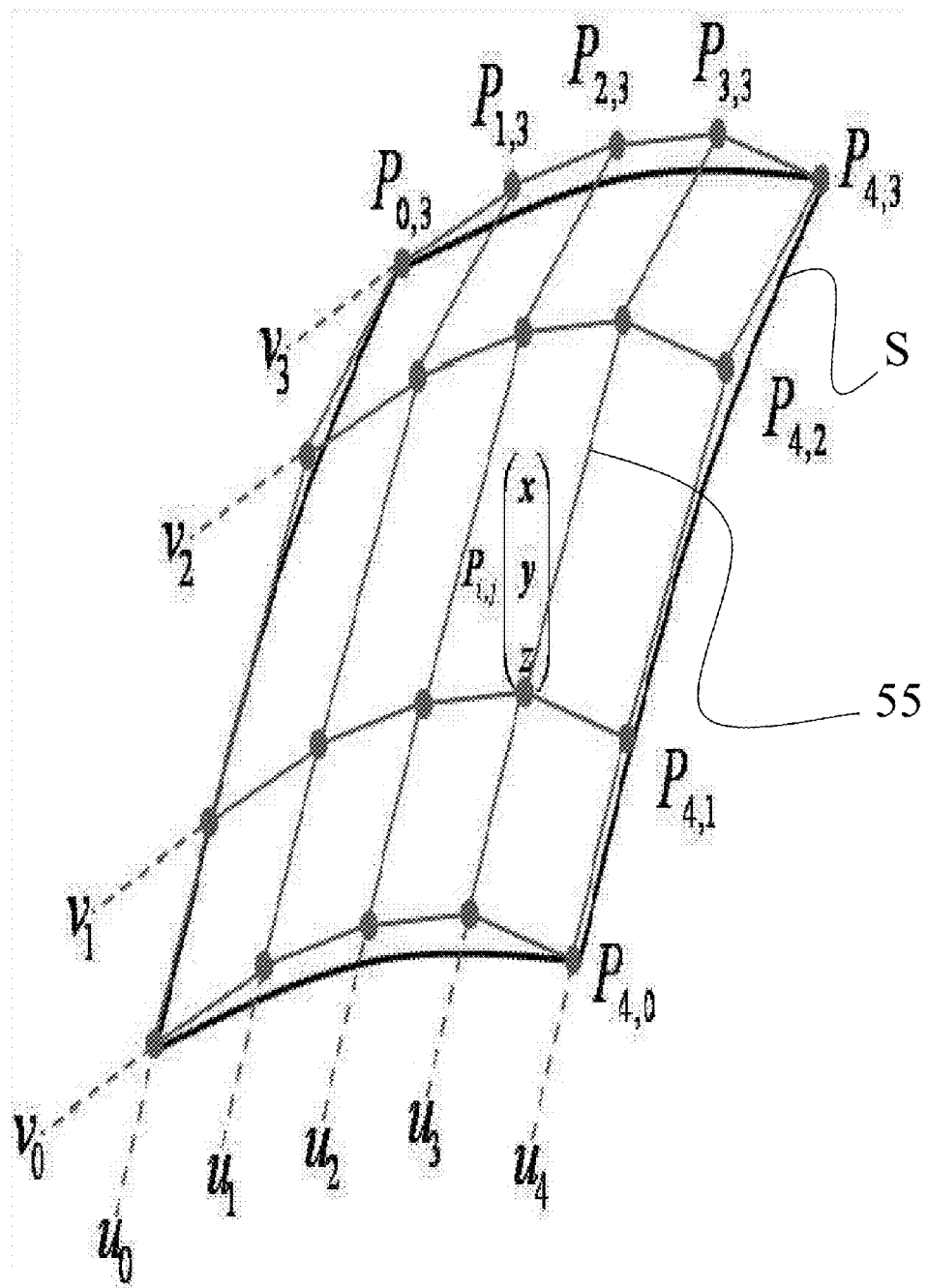
FIGS. 5-12 show examples of the compression of NURBS.

FIG. 5 provides an example of a NURBS surface S where M=5 and N=4. The control points $(P_{i,j})_{[0 \leq i < 5, 0 \leq j < 4]}$ of coordinates x, y, z are the intersections of the grid 55. As explained above, for each control points $P_{i,j}$ the couple of Gréville parameters ($u_i$, $v_j$), which are represented, may be computed as already explained above. For example, if the couple of degrees of the surface is (d=2, g=4) and the knot vectors of the surface are ($u\_knot_1$, ..., $u\_knot_6$) and ($v\_knot_1$, ..., $u\_knot_7$), then typically $$u_i = \frac{u\_knot_{i+1} + \ldots + u\_knot_{i+d}}{d} \text{ and}$$

$$v_j = \frac{v\_knot_{j+1} + \ldots + v\_knot_{j+g}}{g}.$$

However, other formulas may be used.

Each of the control points of a NURBS is defined with three floating point values representing the x, y, and z coordinates. If the dimensions of the array is M*N, the storage size required for storing the control points of the NURBS surface is 3*M*N*64 bits without compression. The Applicant has noticed that in some industrial models the size of the floating point values representing the coordinates of the control points of the NURBS surfaces of the models makes up to more than 50% of the total model size. Thus, the method is particularly efficient for the compression of a CAD file which contains NURBS surfaces.

In the following, an example of application of the method to compress numerical data, wherein the actual values of the set are coordinates associated to a geometric object and the steps of computing and storing are iterated according to an order of the set, is discussed with reference to FIGS. 6-12. In the example, the actual values are coordinates of control points of a NURBS surface. The surface is not represented but is similar to the surface of FIG. 5. FIGS. 6 to 12 depict a projection 60 of a grid similar to the grid 55 of FIG. 5. The projection 60 is referred to as the "grid" in following. Each intersection of the grid 60 represents a respective control point $P_{i,j}=(x_{i,j}, y_{i,j}, z_{i,j})$ of the surface, wherein vertical lines of the grid represent indices i growing from the left to the right and horizontal lines of the grid represent indices j growing from the bottom to the top.

In the example, the numerical data comprise knot vectors. The method comprises a prior step of storing the knot vectors as such (i.e. without any particular compression scheme). As explained above, the compression process includes browsing the set of floating point actual values according to the order of the set. The numerical data provides the indices (i, j) of the control points. The indices may be used to define the order of the set. For example, if 0≤i<M and 0≤j<N, an order between the control points may be ($P_{0,0}$, $P_{0,M-1}$, $P_{1,0}$, ..., $P_{1,M-1}$ ..., $P_{N-1,0}$, ..., $P_{N-1,M-1}$). In other words, indices i and j grow from their respective downer boundary to their respective upper boundary, and i has priority over j. Accordingly, the set of floating point actual values may be ordered the following way: $((x, y, z)_{0 \leq j < N})_{0 \leq i < M}$. In this case, the browsing of the set will lead to browsing the three coordinates of a control point before browsing the next control point. This allows the use of the three coordinates at the step of computing a predicted value. Alternatively, the set may be ordered as following: $((x_{0 \leq j < N})_{0 \leq i < M}, (y_{0 \leq j < N})_{0 \leq i < M}, (z_{0 \leq j < N})_{0 \leq i < M})$. In this case, the browsing of the set will lead to browsing all x coordinates, then all y coordinates and then all z coordinates. The principles explained below allow the implementation of any of the two alternate solutions.

Figure 6:
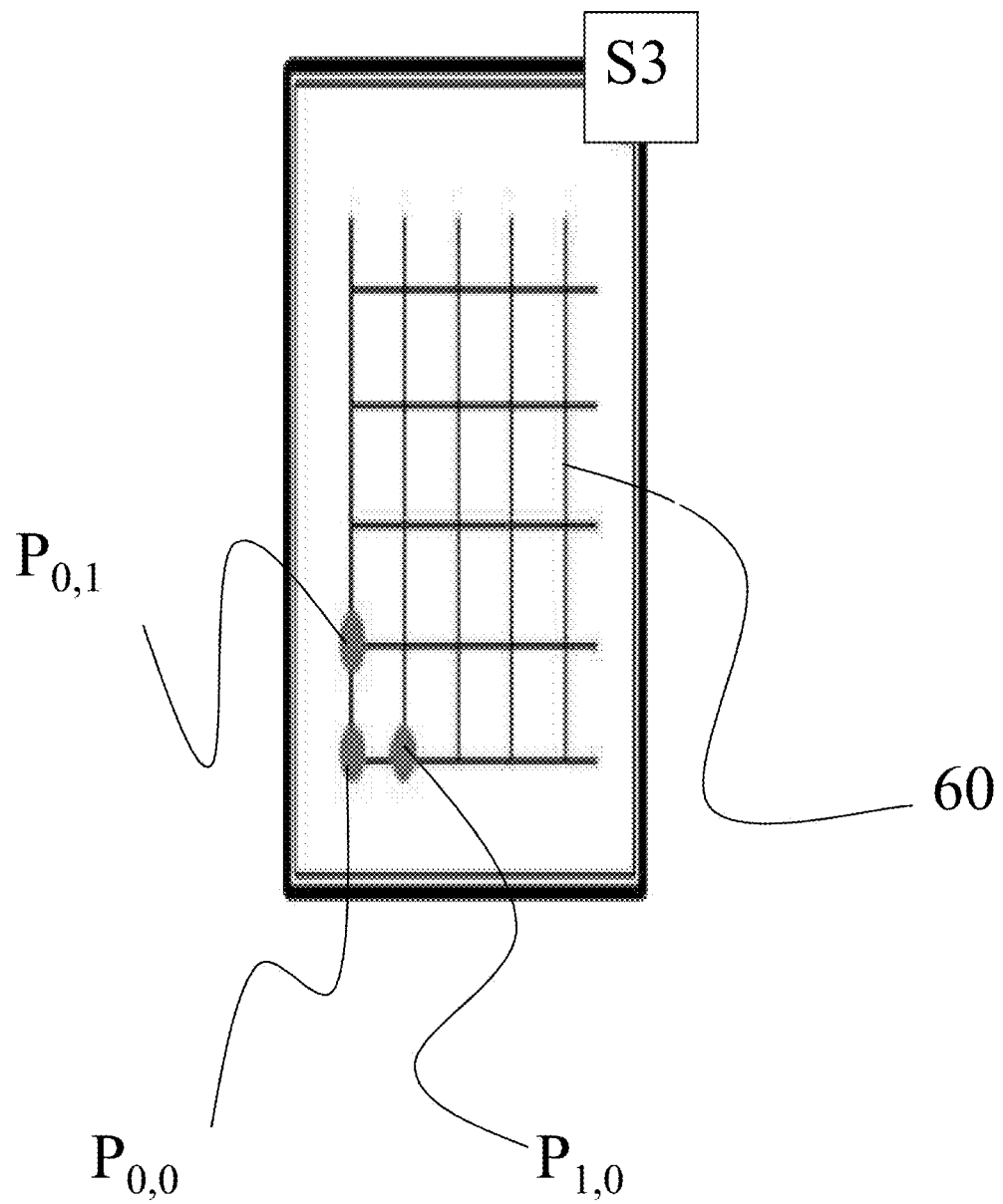

As shown on FIG. 6, the method of the example comprises a step S3 of storing the three control points $P_{0,0}$, $P_{1,0}$, $P_{0,1}$ of respective indices (0, 0), (1, 0) and (0, 1), without any particular compression scheme. In practice, for each of the coordinates x, y, j, three beginning actual values of the set (($x_{0,0}$, $x_{1,0}$, $x_{0,1}$), ($y_{0,0}$, $y_{1,0}$, $y_{0,1}$), ($z_{0,0}$, $z_{1,0}$, $z_{0,1}$)) are stored as such (nine beginning actual values in total). In the following, the floating point actual values are indifferently referred to by the coordinate they represent or by the control point of which they represent a coordinate.

Figure 7:
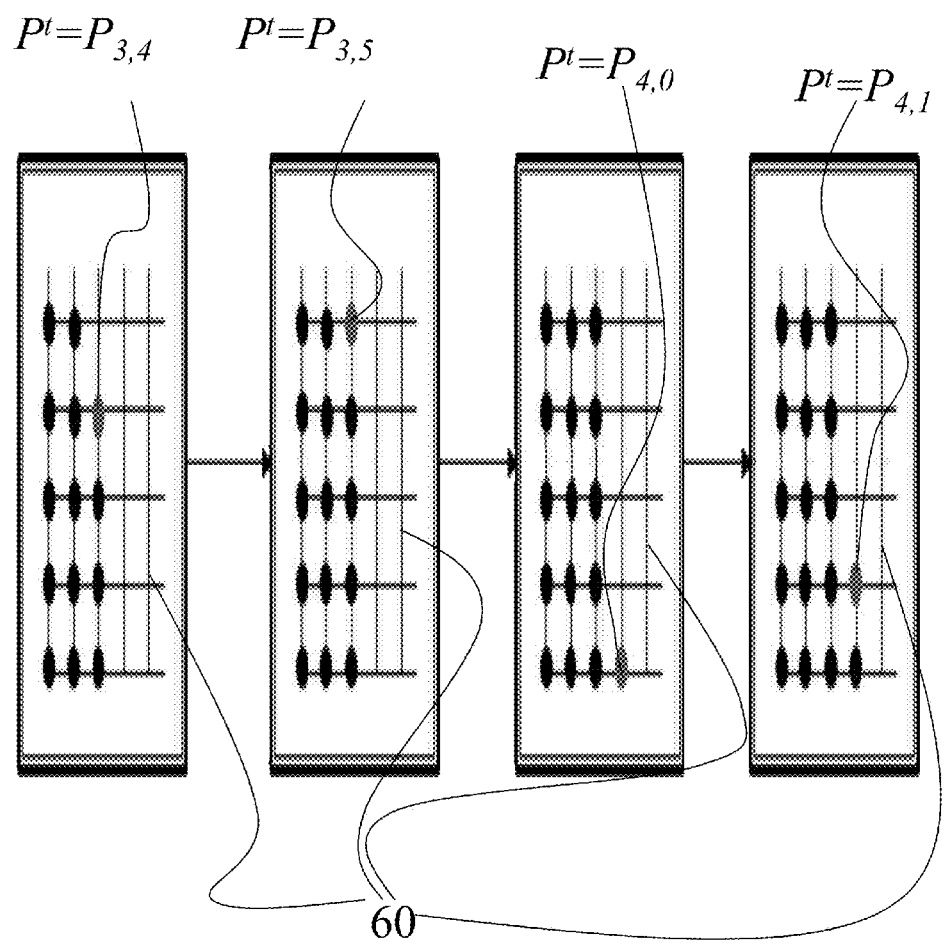

The grid is then parsed from bottom up and from left to right. The points already stored in step S3 are skipped. The method described with reference to one of FIGS. 2-4 is applied to the remainder of the control points. FIG. 7 shows four successive iterations (k=11, k=12, k=13 and k=14) of the method. At each iteration k (wherein k is determined by the indices i,j of the parsing and the number of beginning values stored, which is 3*3 in this example), the prediction scheme of the example which is used to compute S10 the predicted value $pred_k^t$ related to the target value $val_k^t$ includes calculations which depend on the indices (i_t, j_t) of the control point $P^t = P_{i\_t, j\_t}$ represented by the target (assimilated to the target below). These indices are linked with the rank of the iteration k as stated above (k may thus be written (i_t, j_t)). Depending on theses indices, the method determines a subset of control points stored in previous iterations. The method determines a polynom Q(u,v) so that for each of the control points $P_{i,j}$ of the subset we have Q($u_i$, $v_j$)=$P_{i,j}$. The maximum number authorized for the degree of the polynom Q thus determined is related to the number of control points of the subset. The coefficients of Q are thus determined according to the values of $P_{i,j}$ and to parameters ($u_i$, $v_j$). The parameters ($u_i$, $v_j$) may be the Gréville parameters defined above. The predicted value for the target control point is computed as $pred_{(i\_t, j\_t)} = Q(u_{i\_t}, v_{j\_t})$. This prediction is defined independently for the 3 coordinates x, y and z. The formula thus applies to the three coordinates (e.g. Q and P are vectors of dimension 3). The above scheme is based on a polynomial interpolation. Other schemes may be implemented. For example, regressions or other types of interpolations may be used.

FIGS. 8 to 12 show an example of the determination of the subset and of the definition of Q according to the value of the indices (i_t,j_t) of the target $P^t$ in different situations. The leftmost frame on each of FIGS. 8 to 12 shows on the grid 60 all the different target points $P^t$ to which the situation corresponds. The rightmost frame shows an example of such a target point $P^t$ to which the situation corresponds, as well as the general formula 88 for the polynom Q(u,v) used in the prediction scheme presented above in the case of the example. The rightmost frame also provides whether the exact formula 92 of Q(u,v) in the case of the example, or a system of equations 90 leading to the coefficients of Q(u,v) and thus leading to the exact formula in the case of the example.

In the example of FIGS. 8 to 12, the actual values of the subset are coordinates of control points of the geometric object neighboring another control point of the geometric object of which coordinate is represented by the target actual value. In other words, the predicted value $\text{pred}_{(i\_t,j\_t)}$ of the target control point $P^t$ is performed according to previously parsed control points which are the neighbors of the target on the grid. Two points $P_{i1,j1}$ and $P_{i2,j2}$ are said to be neighbors on the grid 60 if $\max(|i1-i2|,|j1-j2|) \leq s$, (i.e. the graph distance between $P_{i1,j1}$ and $P_{i2,j2}$ on the grid 60 is smaller than s), wherein s=1, or s=3, and more preferably s=2. Using neighboring points to predict the target allows a good compression rate when applying the method to a surface which presents locally smooth variations because the prediction is accurate. Limiting the distance allowed between two points on the grid to determine whether or not they are neighbors reduces the time required for the compression, while not necessarily leading to a reduced accuracy of the prediction. Indeed, control points far from the target are not necessarily of any help when predicting the target.

Figure 8:
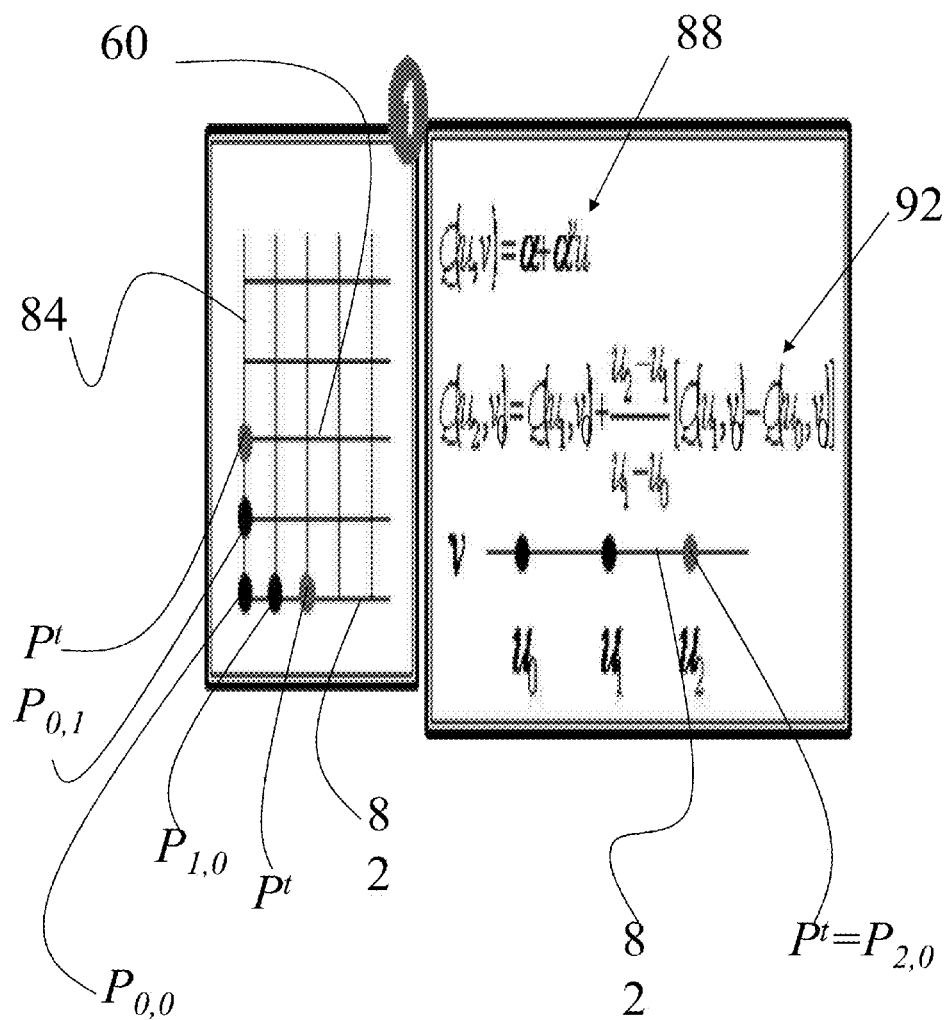

FIG. 8 describes the basics of how the step of computing S10 a predicted value $\text{pred}_{(i\_t,j\_t)}$ is performed when $(i\_t,j\_t)=$(2,0) or (0,2). The two target points $P^t$ corresponding to this situation are respectively located on a downer boundary 82 and a leftmost boundary 84 of the grid 60. In general, the boundaries of a surface present some regularity. Thus, an accurate prediction for target points on a boundary may be one performed according to control points on the same boundary. For example, the prediction $\text{pred}_{(2,0)}$ for $P_{2,0}$ may be performed using the above scheme wherein the subset consists of $P_{0,0}$ and $P_{1,0}$. This leads to the exact formula $$92 \; \text{pred}_{(i\_t,j\_t)} = Q(u_2, v_0) = Q(u_1, v_0) + \frac{u_2 - u_1}{u_1 - u_0}[Q(u_1, v_0) - Q(u_0, v_0)].$$

This is represented in the rightmost frame of FIG. 8. $P_{0,2}$ may be similarly predicted with the subset $P_{0,0}$ and $P_{0,1}$. The above may be similarly applied to compute $\text{pred}_{(0,2)}$.

Figure 9:
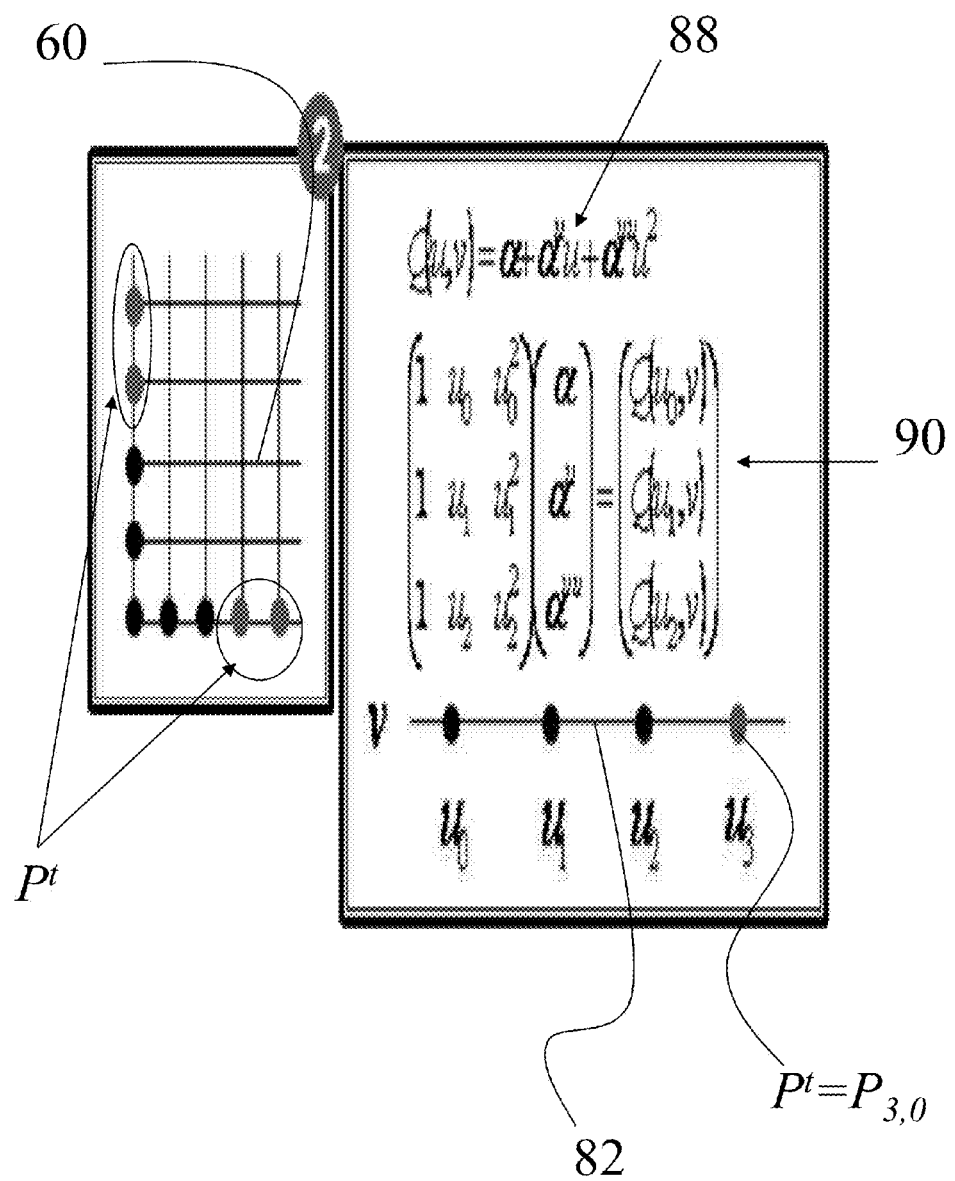
Figure 10:
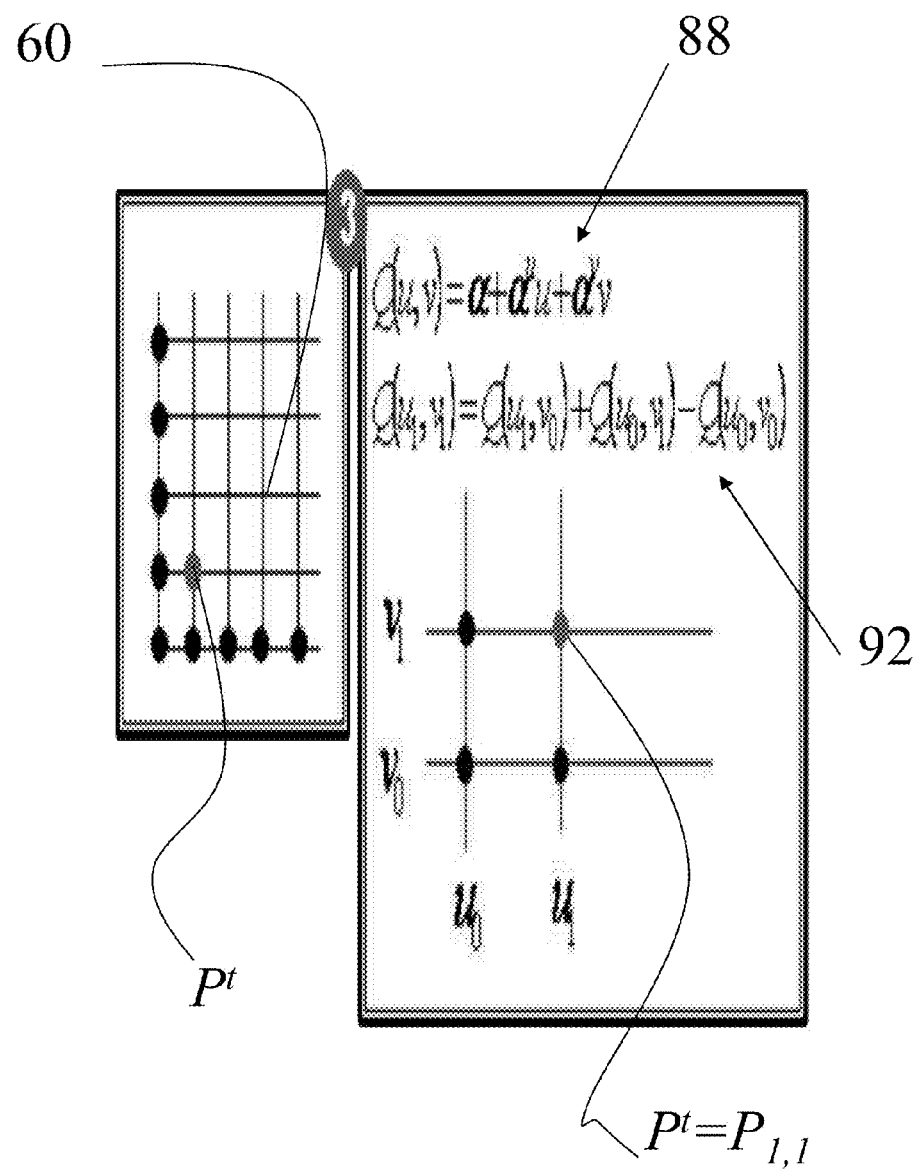
Figure 11:
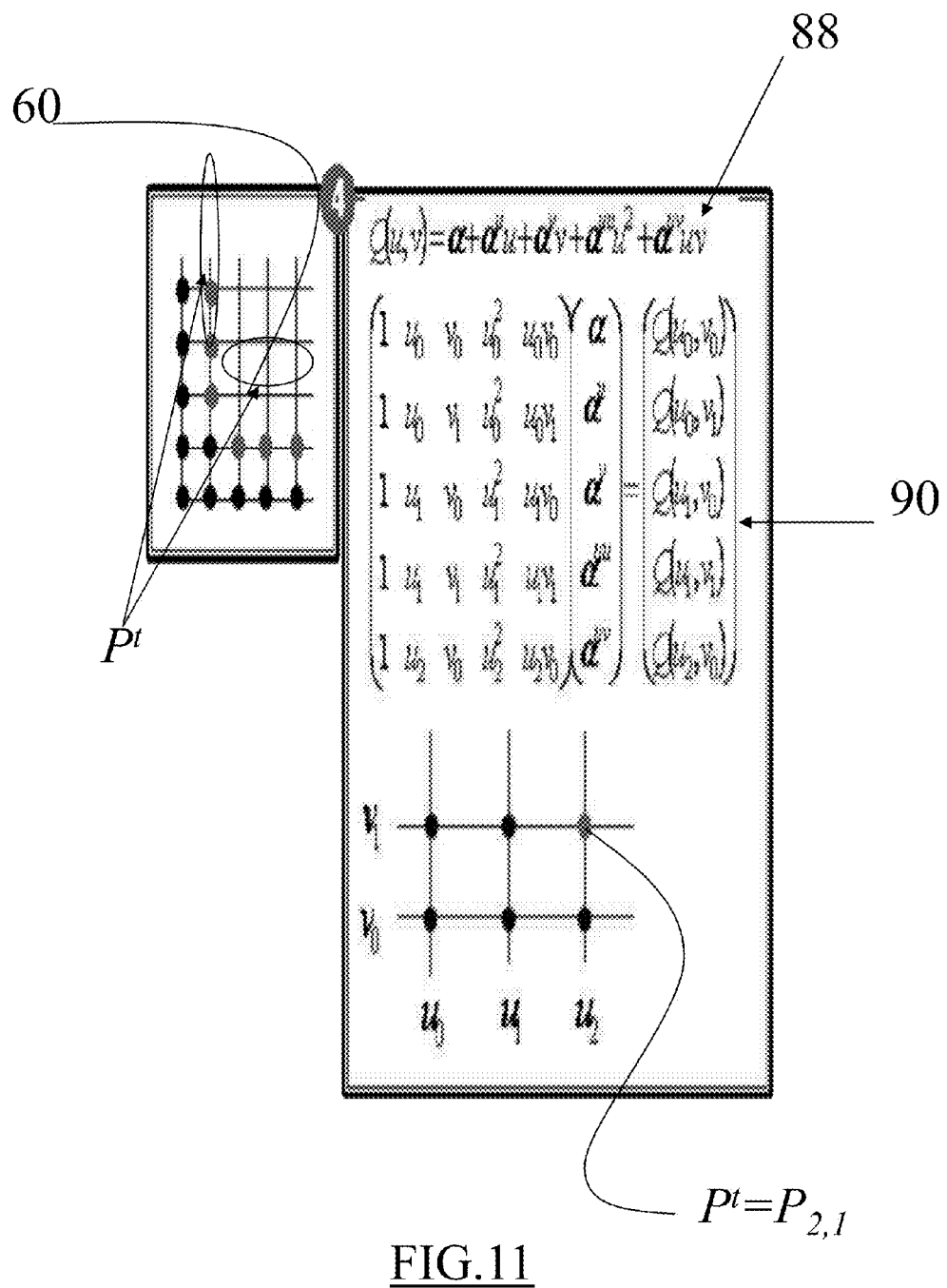
Figure 12:
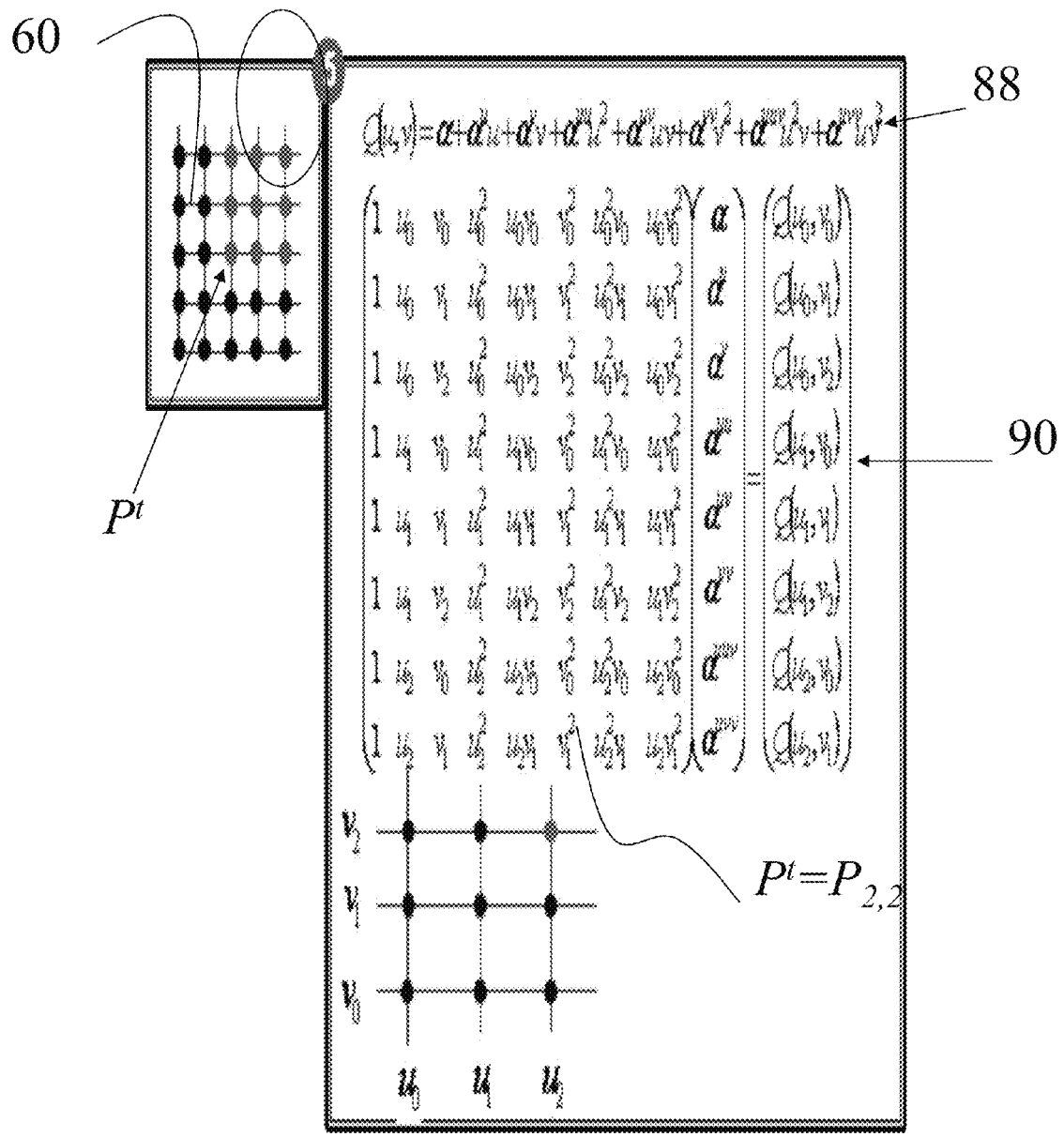

FIGS. 9 to 12 similarly describe other situations where computing $\text{pred}_{(i\_t,j\_t)}$ is performed differently. FIG. 9 describes a situation where (i_t=0 and j_t≥3) or (j_t=0 and i_t≥3). Q is respectively determined according to ($P_{0,j\_t-1}$, $P_{0,j\_t-2}$ and $P_{0,j\_t-3}$) or ($P_{i\_t-1,0}$, $P_{i\_t-2,0}$ and $P_{i\_t-3,0}$). FIG. 10 describes a situation where i_t=j_t=0 and Q is determined according to $P_{0,0}$, $P_{0,1}$ and $P_{1,0}$. FIG. 11 describes a situation where i_t=1 and j_t≥2) or (i_t=1 and i_t≥2). Q is respectively determined according to ($P_{0,j\_t}$, $P_{0,j\_t-1}$, $P_{0,j\_t-2}$, $P_{1,j\_t-1}$ and $P_{1,j\_t-2}$) or ($P_{i\_t,0}$, $P_{i\_t-1,0}$, $P_{i\_t-2,1}$, $P_{i\_t-1,1}$ and $P_{i\_t-2,1}$). FIG. 11 describes the general situation where i_t≥2 and j_t≥2. Q is determined according to $P_{i\_t,j\_t-1}$, $P_{i\_t,j\_t-2}$, $P_{i\_t-1,j\_t}$, $P_{i\_t-2,j\_t}$, $P_{i\_t-1,j\_t-1}$, $P_{i\_t-2,j\_t-1}$, $P_{i\_t-1,j\_t-2}$ and $P_{i\_t-2,j\_t-2}$.

In the example, the prediction is computed independently for the three coordinates x, y and z. It involves solving a linear system 90 of the form AX=B where A is a square matrix, X is a vector containing the unknown coefficients of the polynom Q, and B is a vector. As can be understood, the computation of the prediction can be done using only the four arithmetic operations (addition, subtraction, multiplication, division). Indeed, as explained earlier, the Gréville parameters can be computed from the knot vectors using well-known techniques using only the four arithmetic operations. The coefficients of A can in turn be computed from the Gréville parameters using only multiplication. The coefficients of the vector B are the coordinates of the control points that have already been stored in previous iterations, so no computation is needed to obtain them for this computation. Solving an equation of the type AX=B can be done using well-known techniques that involve only the four arithmetic operations, for example the Gauss pivot. This yields the coefficients of X, which are the coefficients of the polynom Q. Then computing the prediction as $\text{pred}_{(i\_t,j\_t)}{}^t = Q(u_{i\_t}, v_{j\_t})$ can be done using only the 4 arithmetic operations.

In the general case, the predicted value is determined according to at least one parameter associated to said another control point, the actual values of the subset, and at least one parameter associated to each control point neighboring said another control point. Each neighboring control point has at least one parameter associated to it. In the above example, the predicted value is indeed determined according to two parameters associated to the target control point (the Gréville parameters), to the actual values of the subset (the coordinates of the neighboring control points), to two parameters associated to each neighboring control point (the Gréville parameters). In the above example, the prediction function is a rational function of the preceding parameters which results from the particular prediction scheme detailed with reference to FIGS. 8-12. This scheme is appropriate for an accurate prediction in the case of smooth surfaces which can be locally approximated by polynomial functions. However, other functions of which determination according to the control points of the subset and of which evaluation for the prediction only involves arithmetic operations, may result from other prediction schemes, for example for other kinds of NURBS. The prediction scheme may more generally include a prior step of determining a kind of the NURBS (for example through information stored to this effect) and apply different operations accordingly.

The at least one parameters may generally be determined according to a respective knot vector of the geometric object. As already explained, the parameters may be the Gréville parameters as in the above example. In the polynomial approach of the example, the use of the Gréville parameters allows a more accurate prediction by fully making use of the specifications of the surface.

Returning to the example, the step of computing S10 may be performed in a single operation by the evaluation of the rational function for the values of the intervening parameters, or it may be performed in more operations, for example first operations for determining the coefficients of polynom Q from the value of some of the intervening parameters, and one operation for evaluating the polynom at the values of the intervening parameters. This depends on the implementation of the method.

The step of computing a predicted value has been described without consideration of the floating point nature of the values of the set and, if they are used, of the floating point nature of the values of the knot vectors. In general, the prediction scheme involves arithmetic operations. The discussion above assimilated the different values to real numbers to which said operations are performed. Floating point arithmetic may be used to actually perform these operations on these numbers. However, this involves stability issues discussed earlier.

To obtain stability of compression and decompression across different platforms, the method may use an emulation of floating point arithmetic operations with integer arithmetic operations. In general, the computing of a floating point predicted value related to a target actual value of the set may include performing operations on integers corresponding to the sign, to the exponent and/or to the mantissa of actual values of a subset of the set, the said operations emulating floating point arithmetic operations.

The release "SoftFloat" by Hauser (1998) and the article "A Floating-Point Library for Integer Processors" by C. Bertin et al (2004) describe the emulation of 64-bits floating-point numbers. In these works an important requirement is to emulate exactly the specifications of the standard [IEEE 754-1985]. This leads to slow algorithms, in particular for the division operation, which requires several iterations. The method does not have this requirement, and thus an algorithm which is less costly may be designed.

The textbook by Dave Astle and Dave Durnil: OpenGL ES 1.0 Game Development, Chapter 4 "A Fixed Point for Math Primer" (2004) describes an emulation of floating point values using 32-bits integers. The algorithm for the division operation uses an intermediary integer which may be too long for some platforms upon the size of the floating point values of which operations are emulated.

To compute the predicted value, a sequence of arithmetic operations that take as input floating point values are performed by the method of the invention. The method avoids using floating point arithmetic operations, because the result of such a sequence of operations can be different on different platforms. The method thus uses an integer-based emulation of these arithmetic operations. The following provides an example of how the four arithmetic operations (addition, subtraction, multiplication, division) on 64-bits floating points values can be emulated using only operations in 64-bits integers. The emulation provided by the method is fast because the operations for the step of computing a predicted value are performed on integers corresponding to the sign, to the exponent and/or to the mantissa of floating point values. Other requirements of the standard [IEEE 754-1985] or any other standard of floating point values used in the method may be ignored.

The emulation provided below can be implemented on all platforms that support 64-bits integers, which is the case for most platforms used for running CAD software. An emulation that could only be done on platforms that support 128-bits integers would not be wanted, because such platforms are not widely available. It should be noted that the same principles could be applied to implement an emulation of operations on 32-bits floating point numbers on a platform that does not supports 64-bits integer but that supports 32-bits integer.

Let a be a 64-bit floating point value (any of the values used in the step of computing the predicted value) in the [IEEE-754] standard. As already explained earlier, it is possible to write a=(s, e, m) with the following components: the sign s (1 bit), the exponent e (11 bits), and the mantissa m (52 bits).

Floating point value a may be associated to an integer based format (also called "emulation format" in the following) value A represented by a set of three 64-bits integers such that A=(S, E, M), with the sign S (unsigned 64-bits integer), the exponent E (signed 64-bits integer), and the mantissa M (unsigned 64-bits integer). The data representing the value A may for example be an array of three integers each representing S, E or M. Such data may be created for the purpose of the prediction.

Each number in these formats represents the value of a real number (in the mathematical sense). Let us take the following notations for these values:

$$\{\tilde{a}, \tilde{A}\} \in \Re$$

$\tilde{a}$ is the value of a
$\tilde{A}$ is the value of A

In the following, rules on how to convert a value in one format to its associated value in the other format are provided.

If a is a normalized value in the [IEEE-754] format, then $0 < e < 2^{11}$ and the value of the number a=(s, e, m) is:

$$\tilde{a} = (-1)^s * 2^{e\text{-bias}} * \left(1 + \frac{m}{2^{52}}\right) \text{ with bias} = 2^{11-1} - 1 = 1023.$$

The result of the conversion of a into the integer-based format is A=(S, E, M) with:

$S=s$ $E=e-\text{bias}$ $M=2^{63}+m*2^{11}$

The value of the real number is defined as:

$$\tilde{A} = (-1)^S * 2^E * \frac{M}{2^{63}} = \tilde{a}$$

Conversion from the emulation format back into the [IEEE-754] format is straightforward (for converting M into m, we ignore the 11 least significant bits of m).

If a is a zero or a denormalized numbers (i.e. e=0). To convert into the integer-based format, the following rules may be applied:

$S=0$ $E=-\text{bias}$ $M=0$ $\tilde{A}=0$

In other words, all zero or denormalized numbers are converted into zero. Conversion back into the [IEEE-754] format is straightforward.

If a is an invalid number in the [IEEE-754] format (i.e. $e=2^{11}-1$), to convert into the emulation format, we set:

$S=0$ $E=2^{11}-1-\text{bias}.$ $M=0$

Thanks to this conversion of the floating values into the emulation format, the operations used may comprise arithmetic operations including integer addition, subtraction, multiplication and/or division and/or bitwise operations including bits shifts and/or leading zero count. Such operations ensure stability and may thus be used to compute the predicted value.

In general, to perform a sequence of arithmetic operations on floating point values, the values may first be converted into their equivalent in an integer-based format, e.g. the emulation format described above. The method may then perform the sequence of arithmetic operations on these equivalent numbers. In the following, an example of how to perform the four arithmetic operations on two operands A and B expressed in the integer-based format is provided. Let us describe here the requirements of such arithmetic operations. Let us consider any of the four operations with the following notation: $x \otimes y$ [here $\otimes$ can be any of +−*/].

Let us consider the following hypothesis:

$$A=(S_A, E_A, M_A)$$

$$B=(S_B, E_B, M_B)$$

$\tilde{A}$ is the value of A
$\tilde{B}$ is the value of B
$\tilde{C}_{Exact} = \tilde{A} \otimes \tilde{B}$ result of the operation on the real numbers we want to compute $$C = A \otimes B = (S_C, E_C, M_C)$$

so that $$|\tilde{C} - \tilde{C}_{Exact}| < \tilde{C}_{Exact} * 2^{-52}$$

with $\tilde{C}$ the value of C.

The objective may be to compute $(S_C, E_C, M_C)$ by using only arithmetic operations on 64-bits integer (without overflow) and arithmetic bitwise shifts (as previously said, the method avoids operations on floating point values because they are not stable across all platforms). These requirements are the same for all operations (+, −, *, /). The following notations may be adopted for the explanations, where M is a 64-bits integer:

M<<n: left shift of n bits of the integer M.
M>>n: right shift of n bits of the integer M.
LZC(M): leading zero count of M (i.e. number of consecutive zeros on the left of M)
$M^+ = (M >> 32)$.
$M^- = (M<<32)>>32$: the 32 more significant bits of M are set to zero In the following, rules for the addition are provided. As the addition is commutative, we can assume that we have $\tilde{A} \geq \tilde{B}$.

If A and B have the same sign, we have:

$$\tilde{C}_{Exact} = \tilde{A} + \tilde{B} = (-1)^{S_A} * \frac{2^{E_A+1}}{2^{63}} * M_{Exact}$$

with $$M_{Exact} = M_A * 2^{-1} + M_B * 2^{E_B - E_A - 1}$$

The objective is to define a 64-bits integer M that is an approximation of $M_{Exact}$ and that can be computed using only integer arithmetic and bitwise shift, while ensuring that the real number $\tilde{C}$ corresponding to M is not too far from $\tilde{C}_{Exact}$ (for example ensuring $|\tilde{C} - \tilde{C}_{Exact}| < \tilde{C}_{Exact} * 2^{-52}$). $M = (M_A >> 1) + (M_B >> (E_B - E_A - 1))$ is convenient. It is easy to check that the computation of such M causes no overflow and that M is a good enough approximation of $M_{Exact}$, e.g. $|M_{Exact} - M| < M_{Exact} * 2^{-52}$. The method may thus compute C as:

$$C = (S_C, E_C, M_C)$$

$$S_C = S_A$$

$$E_C = E_A + 1 - LZC(M)$$

$$M_C = M << LZC(M)$$

If A and B have a different sign, we have:

$$\tilde{C}_{Exact} = \tilde{A} + \tilde{B} = (-1)^{S_A} * \frac{2^{E_A}}{2^{63}} * M_{Exact}$$

with $$M_{Exact} = M_A - M_B * 2^{E_B - E_A}$$

A similar approach leads to $M = M_A - (M_B >> (E_B - E_A))$ and to:

$$C = (S_C, E_C, M_C)$$

$$S_C = S_A$$

$$E_C = E_A - LZC(M)$$

$$M_C = M >> LZC(M)$$

For computing a subtraction between two operands, the method performs the addition on the operands A and (−B) as with the addition defined above.

For the multiplication, we have:

$$\tilde{C}_{Exact} = \tilde{A} * \tilde{B} = (-1)^{S_A + S_B} * \frac{2^{E_A + E_B + 1}}{2^{63}} * M_{Exact}$$

with $$M_{Exact} = M_A * M_B * 2^{-64}$$

It is easy to check that $0 < M_{Exact} \leq 2^{64} - 1$.

We want to define a 64-bits integer M that is an approximation of $M_{Exact}$ and that can be computed using only integer arithmetic and bitwise shift. We write $M_{Exact}$ as:

$$M_A = M_A^+ * 2^{32} + M_A^-$$

$$M_B = M_B^+ * 2^{32} + M_B^-$$

$$M_{Exact} = M_A^+ * M_B^+ + (M_A^+ * M_B^- + M_B^+ * M_A^-) * 2^{-32} + M_A^- * M_B^- * 2^{-64}$$

We compute M as:

$$M = M_A^+ * M_B^+ + ((M_A^+ * M_B^-) >> 32) + ((M_B^+ * M_A^-) >> 32)$$

The operations in the formula above can be performed using 64-bit integer arithmetic without causing overflow, because all the products have operands that have their 32 most significant bits set to null. It is also easy to see that the sum of these products fits into a 64-bits integer without overflow, because we have:

$$M \leq M_{Exact}$$

and so $M \leq 2^{64} - 1$

It is easy to check that M is a good enough approximation of $M_{Exact}$:

$$|M_{Exact} - M| < M_{Exact} * 2^{-52}$$

We finally define C as:

$$C = (S_C, E_C, M_C)$$

$$S_C = S_A + S_B \bmod 2$$

$$E_C = E_A + E_B + 1 - LZC(M)$$

$$M_C = M << LZC(M)$$

And it is easy to check that: $|\tilde{C} - \tilde{C}_{Exact}| < \tilde{C}_{Exact} * 2^{-52}$ The following provides rules for the division. The division may be defined on real numbers and noted:

$$a = b/c$$

or $$a = \frac{b}{c}$$

with $$a \in \mathbb{R}$$

The division may also be defined on 64-bits unsigned integer. It may be noted $$Q=d(A,B)$$

$$R=r(A,B)$$

$$A=B*Q+R$$

$$R<B$$

(where A, B, Q, R are unsigned 64 bits-integer; Q is the quotient and R is the remainder of the division of A by B). We have:

$$\tilde{C}_{Exact} = \tilde{A}/\tilde{B} = (-1)^{S_A+S_B} * \frac{2^{E_A+E_B}}{2^{63}} * M_{Exact}$$

with $$M_{Exact} = \frac{M_A}{M_B} * 2^{63}$$

We can easily see that we have:

$$0 < M_{Exact} \leq 2^{64}-1$$

The goal is to define a 64-bits integer M that is an approximation of $M_{Exact}$ and that can be computed using only integer arithmetic and bitwise shift. We write $M_{Exact}$ as:

$$M_{Exact} = \frac{M_A * 2^{63}}{M_B^+ * 2^{32} + M_B^-} = D\left(\frac{1}{1+\lambda}\right)$$

with $$\lambda = \frac{M_B^-}{M_B^+} * 2^{-32} < 2^{-31}$$

and $$D = \frac{M_A * 2^{31}}{M_B^+}$$

$$M_{Exact} = D(1-\lambda) + \varepsilon$$

with $$\varepsilon < D*\lambda^2 < 2^{-62} M_{Exact}$$

We can express:

$$D = \frac{M_A * 2^{31}}{M_B^+} = d(M_A, M_B^+) * 2^{31} + \frac{r(M_A, M_B^+) * 2^{32}}{M_B^+} * 2^{-1}$$

$$D = E + \varepsilon'$$

with $$E = d(M_A, M_B^+) * 2^{31} + d(r(M_A, M_B^+) * 2^{32}, M_B^+) * 2^{-1}$$

and $$\varepsilon' < 2^{-63} D < 2^{-63} M_{Exact}$$

And:

$$D\lambda = (E*2^{-32}*(d(M_B^+*2^{32}, M_B^-)*2^{-1}))*2^{-31} + \varepsilon''$$

with $\varepsilon'' < 2^{-61} M_{Exact}$

Finally, we compute M as:

$$F = d(M_A, M_B^+) << 31 + d(r(M_A, M_B^+) << 32, M_B^+) >> 1$$

$$M = F - ((F>>32) * ((d(M_B^+ << 32, M_B^-) >> 1)) >> 31)$$

We can see that the operations in the formula above can be performed using 64-bit integer arithmetic without causing overflow.

It is easy to check that M is a good enough approximation of $M_{Exact}$: $|M_{Exact}-M| < M_{Exact} * 2^{-52}$.

We finally define C as:

$$C=(S_C, E_C, M_C)$$

$$S_C = S_A + S_B \bmod 2$$

$$E_C = E_A + E_B + 1 - LZC(M)$$

$$M_C = M << LZC(M)$$

And it is easy to check that:

$$|\tilde{C} - \tilde{C}_{Exact}| < \tilde{C}_{Exact} * 2^{-52}$$

The above explanations exposed examples of how to compute a predicted value of the target by emulating floating point arithmetic by operations on integers. Other kinds of emulation may however be implemented, for example the ones already known from prior art. The following provides an example of storing a bit sequence representative of a difference between integers derived from the target actual value and the predicted value, thus achieving compression for any of the above examples.

In this example, the integers derived from the target actual value and the predicted value are the integers defined by the strings which respectively define the target actual value and the predicted value. More specifically, a mapping to integer representation similar to the one described by Engelson et al. is used. This allows a fast and resource saving determination of the bit sequence.

For the purpose of decompression, the bit sequence representative of the difference may comprise a prefix bit sequence indicative of a number of significant bits and a body bit sequence equal to the difference to which leading zeros, and preferably for even higher compression, also the first bit equal to one, are cut and of which size is the number of significant bits. The prefix bit allows a decompression method to identify the size of the body bit sequence to be read, while the body bit sequence contains the information necessary to retrieve the target value which has been compressed. This is more detailed in the following example referring to two 64-bits floating point values a and p, expressed in the [IEEE-754] format:

$$a=(s_a, e_a, m_a)$$

$$p=(s_p, e_p, m_p)$$

The value a is the target floating point value, and the value p is a prediction for a. The method computes from these two values a bit sequence B that represents the compression of a. The sequence B is defined so that a can be retrieved from the bit sequence B and from p; and B must be defined so that its size is small if a and p are close. In the context of the compression of a NURBS surface described above, the value a is any coordinate x, y, or z of the current point; and p is the prediction for the same coordinate of this current point.

Let $f=(s_F, e_F, m_F)$ be a 64-bits floating point number expressed in the [IEEE-754] format. The mapping to integer off used by the example of the method, is noted as Int(f) and is the 64-bit unsigned integer represented by the same 64-bit string as f We also note the inverse function of this mapping as Real, so that we have Real(Int(f))=f.

We define the unsigned 64-bits integer D and the 1-bit number S as:

$$\begin{cases} \text{if } (Int(a) \geq Int(p)) \\ \text{then} \\ \quad \begin{cases} D = Int(a) - Int(p) \\ S = 0 \end{cases} \\ \text{if } (Int(p) \geq Int(a)) \\ \text{then} \\ \quad \begin{cases} D = Int(p) - Int(a) \\ S = 1 \end{cases} \end{cases}$$

Let N=LeadingZeros(D) be the number of leading 0 of D. D is represented by the following bit sequence:

$$\begin{cases} \text{if } (N \leq 63) \\ \text{then} \\ \quad \begin{cases} D = \underbrace{\underbrace{00 \ldots 01}_{N \text{ bits}} \underbrace{x_1 x_2 \ldots x_k}_{k \text{ bits}}}_{64 \text{ bits}} \\ \text{with } x_i \in \{0, 1\} \\ \text{and } k = 64 - 1 - N \end{cases} \\ \text{if } (N = 64) \\ \text{then} \\ \quad \begin{cases} D = \underbrace{00 \ldots 0}_{64 \text{ bits}} \end{cases} \end{cases}$$

We define a bit sequence B=Compressed(a, p) that is the compressed form of a. We distinguish 3 cases according to the value of N.

Case1: if $(N = 64)$ then $B = \left[\underbrace{000000}_{6 \text{ bits}}\right]$ Case2: if $(2 \leq N \leq 63)$ then $B = \left[\underbrace{Bin(k+1)}_{6 \text{ bits}}, \underbrace{x_1 x_2 \ldots x_k}_{k \text{ bits}}, \underbrace{S}_{1 \text{ bit}}\right]$ Case3: if $(N \leq 1)$ then $B = \left[\underbrace{111111}_{6 \text{ bits}}, \underbrace{a}_{64 \text{ bits}}\right]$ The prefix bit sequence Bin(k+1) is the value of (k+1) expressed as an unsigned binary number.

Another compression scheme, not necessarily based on the structure of the set, can additionally be used to compress the numerical data. For example, entropy coding can be used on the data after it is compressed by the operations described above. Thus, the method may comprise a step of compressing again the numerical data, for example using entropy coding.

Figure 13:
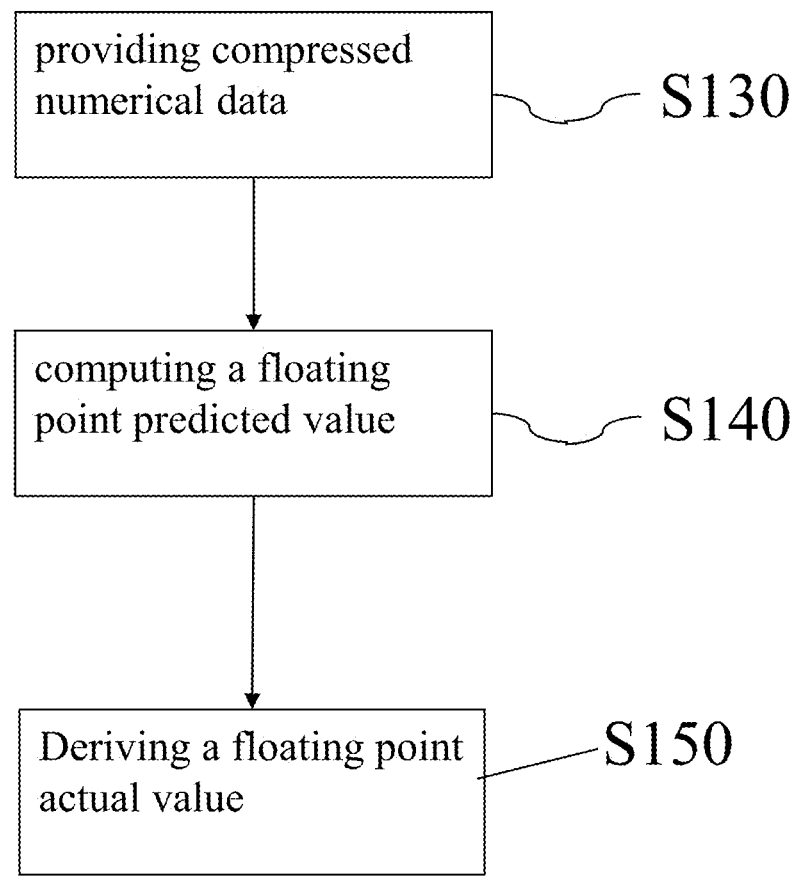
FIG. 13 show an example of a decompression method.

As shown on FIG. 13, the invention also relates to a computer-implemented method for decompressing numerical data. The numerical data are in general a compressed form of data comprising a structured set of floating point actual values, a floating point value being defined by a sign, an exponent and a mantissa, as defined above. The numerical data include a bit sequence representative of a difference between integers derived from a target actual value of the set and a floating point predicted value related to the target value. The decompression comprises computing S140 the predicted value, the computing including performing operations on integers corresponding to the sign, the exponent and/or the mantissa of actual values of a subset of the set, and deriving S150 the target value from the addition of a bit sequence with an integer derived from the predicted value.

Such a method retrieves an actual value, i.e. the target value, from compressed numerical data, which are thereby exploitable.

The steps of computing and deriving may be iterated according to an order of the set. This is useful when the set comprises at least two actual values which are not stored as such in the numerical data, which include a respective bit sequence as such. This order may be indicated by the numerical data which may thus comprise indications of the order of the set. Such indications may not explicitly relate to the set. For example, when the set is ordered, the compression follow that order as explained earlier. Accordingly, the decompression may simply follow an order displayed by the compressed numerical data, which corresponds to the order of the uncompressed set.

At each iteration, the subset may comprise target values derived at former iterations and/or target values included in the numerical data as such. In other words, the set may comprise actual values which are either included as such in the numerical data and actual values which participate to the compression of the set, by not being included in the numerical data, a respective bit sequence being rather included. In this case, the overall decompression process determines from the numerical data all the actual values of the set. At each iteration of the overall process where the derivation is executed, the actual value to be determined, i.e. the target value, is derived using the subset, as explained above, which may consist of actual values of the set previously determined, in other words target values derived at former iterations and/or target values included in the numerical data as such.

For example, the numerical data further include at least one beginning actual value of the set and the step of computing is iterated over all the other actual values of the set. In this case, at each iteration, the step of computing may be followed by a step of comparing the computed predicted value of the iteration to a threshold, and a step of: deriving the target actual value from the addition of a bit sequence (included in the numerical data) with an integer derived from the predicted value (as above), when the predicted value is higher than the threshold, or incrementing the subset with a target actual value (included as such in the numerical data), when the predicted value of the iteration is lower than the threshold. This determines whether an actual value has been stored as such or has been "compressed" (i.e. a bit sequence has been stored in its place). Alternatively, the numerical data may include information (e.g. prefix bits) that indicate whether the next target value is included as such in the numerical data or is to be derived from a bit sequence included in the numerical data (as explained above). This increases speed of decompression.

Examples of the decompression method will now be explained referring to definitions provided above when describing the compression method. These definitions also apply here. Indeed, although this is not necessarily the case, the numerical data to be decompressed may be obtained by the above compression method.

The actual values of the set may be coordinates associated to a geometric object, preferably coordinates of control points of the geometric object. The actual values of the subset may then be coordinates of control points of the geometric object neighboring another control point of the geometric object, the target actual value being a coordinate of said another control point. The predicted value may be determined according to at least one parameter associated to said another control point, the actual values of the subset, and at least one parameter associated to each control point neighboring said another control point. The at least one parameters may be determined from the numerical data, which may include them as such or include elements allowing the determination of the at least one parameters. For example, the at least one parameters may be determined according to a respective knot vector of the geometric object. The geometric object may be a NURBS surface and the at least one parameters may be the Gréville parameters. The integers derived from the target actual value and the predicted value may be the integers defined by the strings which respectively define the target actual value and the predicted value. The bit sequence representative of the difference may comprise a prefix bit sequence indicative of a number of significant bits, and a body bit sequence equal to the difference to which the leading zeros, and preferably the first bit equal to one, are cut and of which size is the number of significant bits. The operations may comprise arithmetic operations including integer addition, subtraction, multiplication and/or division and/or bitwise operations including bits shifts and/or leading zero count. All these features provide the advantages associated to the compression, explained above.

In the case where the compression has been performed according to the above compression method, the prediction scheme used to compute the predicted value at step S140 is the same prediction scheme used in the compression method. More specifically, referring to the notations previously used in the description of the compression method, when a floating point predicted value p has been computed, the decompression method may comprise a step of reading a bit sequence B. The actual value a corresponding to the predicted value p can be retrieved from the bit sequence B and the prediction p as a=Decompressed(B, p). Referring to the example provided above, the first 6 bits of B are read and interpreted as a 6-bit unsigned integer m. If (m=0) we take: a=p (case 1). If (1≤m≤62) we read the next m bits, which allows to retrieve D and S; then we take a=Real(Int(p)+D) if (S=0) and a=Real (Int(p)−D) if (S=1). If (m=63) we read the next 64 bits and interpret them as the number a.

When the compression has been performed by including iterations, as explained with reference to FIGS. 2-4, the above steps S140 and S150 are correspondingly iterated.

When the compression includes storing beginning values, as explained with reference to FIG. 3, the method of decompression correspondingly reads the beginning values before iterating steps S140 and S150. The beginning values may be used to perform at least the first step of computing S140, serving as a basis for the prediction. The predicted value thus computed may be used to derive in step S150 the actual value to which it corresponds, as explained above. After at least one such step, the retrieved values are used to compute the next steps of computing 140 involved in the iterations of the decompression method. If the compression method involves comparing predicted values to a threshold, to decide whether they are to be compressed or not, as explained with reference to FIG. 4, the decompression method correspondingly performs a comparison of the predicted value computed at step S140 before retrieving the actual value. Upon the result of the comparison, whether the step S150 of deriving is performed to retrieve the actual value, or a step of reading the data is performed (in the case the comparison yielded the decision of not compressing the target value but storing it as such during iteration of the compression method).

When applied to the example of compressed NURBS described earlier with reference to FIGS. 5-12, the decompression method may comprise reading the knot vectors from the stored data. The beginning values which are the coordinates of the three uncompressed control points are then read. The indices of the current control point to be read are determined as explained with reference to FIG. 7. The same prediction scheme as when compressing (i.e. the prediction scheme explained with reference to FIGS. 8-12) is chosen according to the indices of the current control point. The prediction for the next control point is computed for example using the polynomial interpolation. All the data necessary for this computation have already been read at this stage: the knot vectors have been read; and the actual value of the control points required for this computation (according to the prediction scheme chosen) has already been during previous iterations. The coordinates of the current point are read and decoded from their compressed form. This is done by using the prediction. This may be done independently for the 3 coordinates x, y, z. If all the control points of the NURBS surface have been read, the storage process is ended; otherwise.

It is thus to be understood that, in the general case, the decompression method follows the same course which has been followed by the compression method. This known per se from the field of data compression.

The invention also relates to a computer-aided design system. The system comprises a database storing an object modeled by numerical data comprising a structured set of floating point actual values, a graphical user interface, and means for compressing numerical data according to the above presented compressing method and/or decompressing numerical data according to the above presented decompressing method. For example, the numerical data are read and processed by a processor which is coupled to the hard disk. The processor may then compress or decompress the numerical data according to the above methods and stored the corresponding form (compressed or decompressed) in the memory. Such a system allows the modeling of objects with low memory resources. Indeed, as the system may compress numerical data according to the efficient compressing method presented above, more objects may be stored under compressed form in the database of the system as compared to other systems. As the system may decompress numerical data as above, the system may help a user read data which have been compressed. The user can thus take advantage of the compression.

The graphical user interface allows a user to command the compressing of data modeling an object or the decompressing of data modeling an object. The object may be a part, thus modeled by a CAD file. The system may thus store CAD files under compressed form, and decompress them when a designer needs to work on the part, for example by means of the graphical user interface.

Figure 14:
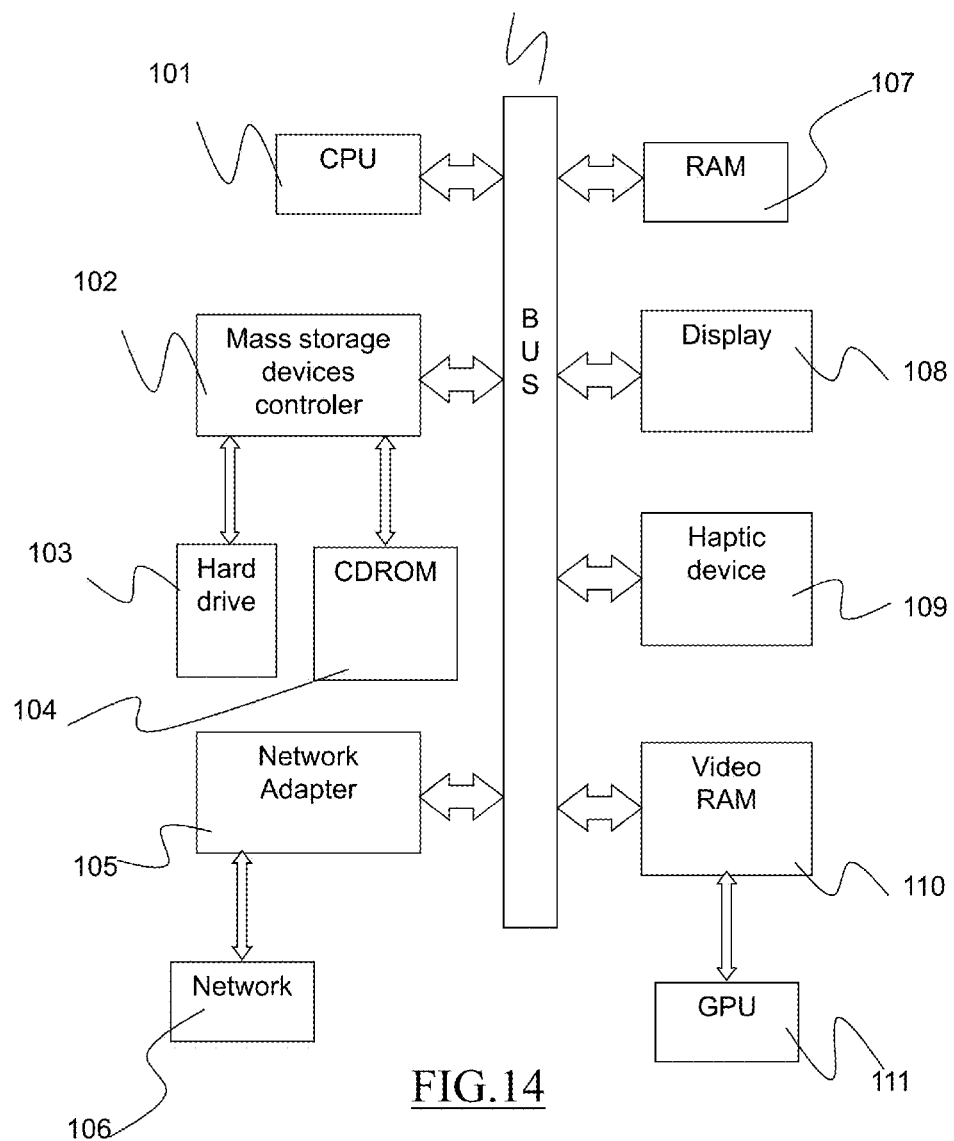
FIG. 14 shows an example of a client computer system suitable for performing the method of the invention.

FIG. 14 shows such a system which is a client computer system, e.g. a workstation of a user.

The client computer comprises a central processing unit (CPU) 101 connected to an internal communication BUS 100, a random access memory (RAM) 107 also connected to the BUS. The client computer is further provided with a graphical processing unit (GPU) 111 which is associated with a video random access memory 110 connected to the BUS. Video RAM 110 is also known in the art as frame buffer. A mass storage device controller 102 manages accesses to a mass memory device, such as hard drive 103. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 104. Any of the foregoing may be supplemented by, or incorporated in, specially designed ASICs (application-specific integrated circuits). A network adapter 105 manages accesses to a network 106. The client computer may also include a haptic device 109 such as cursor control device, a keyboard or the like. A cursor control device is used in the client computer to permit the user to selectively position a cursor at any desired location on display 108. In addition, the cursor control device allows the user to select various commands, and input control signals. The cursor control device includes a number of signal generation devices for input control signals to system. Typically, a cursor control device may be a mouse, the button of the mouse being used to generate the signals.

The invention also relates to a computer program comprising instructions for execution by a computer, the instructions comprising means for performing the above methods. Such a program may be recorded on a computer readable storage medium. Such a program may be added to existing systems and allows such systems to perform the methods presented above. Such a program thus provides existing systems with the advantages of the methods.

The invention uses a prediction encoding scheme to compress floating-point geometric object without loss of information (ie. the compression is lossless). The prediction function performs arithmetic operations by emulating floating-point arithmetic operations using only integer arithmetic operations. This emulation provides accurate result for all four operations (addition, subtraction, multiplication, division), i.e. results that are close to the results one would obtain by using floating-point arithmetic. The prediction is thus accurate. This emulation does not need to follow the whole [IEEE 754-1985] standard, as this is unnecessary in this context.

The invention provides several advantages over prior art.

One of the advantages of the invention is that the compression and the decompression can take place on different software and hardware platforms. This is because the numerical computation of the prediction may be done using an integer-based emulation of floating-point arithmetic. As this emulation involves only operations on integers, the result is exactly the same on all platforms. Thus the prediction computed when compressing or when decompressing is exactly the same; and so the decoding of the coordinates of the current point from their compressed form yields exactly the original values that have been stored during the compression.

The prediction functions of the examples, while based on an emulation of floating-point arithmetic that uses integer arithmetic, give a result that is very close to what would be obtained by using floating-point arithmetic.

The emulation of floating point arithmetic provided in the examples that uses integer arithmetic is faster than other existing such emulations, due to the fact that it does not have to support the whole [IEEE 754-1985] standard.

The prediction scheme is adapted to the type of the geometric object and takes into account the parameterization of the object.

Tests performed on CAD data from automotive industry demonstrate a 45% compression rate, meaning that the 18.3 MB initial zipped file is downsized to a 10 MB zipped file by the compression method of the invention.

The invention claimed is:

1. A computer-implemented method for compressing numerical data, wherein the numerical data comprise a structured set of floating point actual values, a floating point value being defined by a sign, an exponent and a mantissa, the method comprising:
    computing a floating point predicted value related to a target actual value of the set, the computing including interpreting as integers, the sign, exponent and/or mantissa of actual values of a subset of the set, and performing integer operations on integers corresponding to the sign, to the exponent and/or to the mantissa of the actual values of the subset of the set;
    storing a bit sequence representative of a difference between integers derived from the target actual value and the predicted value.

2. The method of claim 1, wherein the steps of computing and storing are iterated according to an order of the set.

3. The method of claim 2, wherein at least one beginning actual value of the set is stored and the step of computing is iterated over all the other actual values of the set, and, at each iteration, is followed by steps of:
    comparing the computed predicted value of the iteration to a threshold; and
    storing:
        (a) a bit sequence representative of a difference between integers derived from the target actual value of the iteration and the predicted value of the iteration, when the predicted value is higher than the threshold, or
        (b) the target actual value of the iteration, when the predicted value of the iteration is lower than the threshold.

4. The method of claim 1, wherein the actual values of the set are coordinates associated to a geometric object, preferably coordinates of control points of the geometric object.

5. The method of claim 4, wherein, the actual values of the subset are coordinates of control points of the geometric object neighboring another control point of the geometric object, the target actual value being a coordinate of said another control point.

6. The method of claim 5, wherein the predicted value is determined according to at least one parameter associated to said another control point, the actual values of the subset, and at least one parameter associated to each control point neighboring said another control point.

7. The method of claim 6, wherein the at least one parameters are determined according to a respective knot vector of the geometric object.

8. The method of claim 7, wherein the geometric object is a NURBS surface and the at least one parameters are the Gréville parameters.

9. The method of claim 1, wherein the integers derived from the target actual value and the predicted value are the integers defined by the strings which respectively define the target actual value and the predicted value.

10. The method of claim 1, wherein the bit sequence representative of the difference comprises:
- a prefix bit sequence indicative of a number of significant bits, and
- a body bit sequence equal to the difference to which the leading zeros, and preferably the first bit equal to one, are cut and of which size is the number of significant bits.

11. The method of claim 1, wherein the operations comprise arithmetic operations including integer addition, subtraction, multiplication and/or division and/or bitwise operations including bits shifts and/or leading zero count.

12. A computer-implemented method for decompressing numerical data, wherein the numerical data are a compressed form of data comprising a structured set of floating point actual values, a floating point value being defined by a sign, an exponent and a mantissa, and wherein the numerical data include a bit sequence representative of a difference between integers derived from a target actual value of the set and a floating point predicted value related to the target value, the method comprising:
- computing the predicted value, the computing including interpreting as integers, the sign, exponent and/or mantissa of actual values of a subset of the set, and performing integer operations on integers corresponding to the sign, the exponent and/or the mantissa of the actual values of the subset, and
- deriving the target actual value from the addition of the bit sequence with an integer derived from the predicted value.

13. A computer-aided design system, wherein the system comprises:
- a database for storing an object modeled by numerical data comprising a structured set of floating point actual values, a floating point value being defined by a sign, an exponent and a mantissa,
- a graphical user interface; and
- a processor coupled with the database for compressing the numerical data according to a method, wherein the method comprises:
  - computing a floating point predicted value related to a target actual value of the set, the computing including interpreting as integers, the sign, exponent and/or mantissa of actual values of a subset of the set, and performing integer operations on integers corresponding to the sign, to the exponent and/or to the mantissa of the actual values of the subset; and
  - storing a bit sequence representative of a difference between integers derived from the target actual value and the predicted value.

14. A computer-aided design system, wherein the system comprises:
- a database for storing an object modeled by numerical data, wherein the numerical data are a compressed form of data comprising a structured set of floating point actual values, a floating point value being defined by a sign, an exponent and a mantissa, and wherein the numerical data include a bit sequence representative of a difference between integers derived from a target actual value of the set and a floating point predicted value related to the target value,
- a graphical user interface; and
- a processor coupled with the database for decompressing the numerical data according to a method, wherein the method comprises:
  - computing the predicted value, the computing including interpreting as integers, the sign, exponent and/or mantissa of actual values of a subset of the set, and performing integer operations on integers corresponding to the sign, the exponent and/or the mantissa of actual values of the subset, and
  - deriving the target actual value from the addition of the bit sequence with an integer derived from the predicted value.

15. A computer readable storage medium having recorded thereon a computer program, wherein the program comprises instructions for execution by a computer, the instructions comprising means for performing a method of compressing numerical data comprising a structured set of floating point actual values, a floating point value being defined by a sign, an exponent and a mantissa, the method comprising:
- computing a floating point predicted value related to a target actual value of the set, the computing including interpreting as integers, the sign, exponent and/or mantissa of actual values of a subset of the set, and performing integer operations on integers corresponding to the sign, to the exponent and/or to the mantissa of actual values of the subset; and
- storing a bit sequence representative of a difference between integers derived from the target actual value and the predicted value.

16. A computer readable storage medium having recorded thereon a computer program, wherein the program comprises instructions for execution by a computer, the instructions comprising means for performing a method of decompressing numerical data, wherein the numerical data are a compressed form of data comprising a structured set of floating point actual values, a floating point value being defined by a sign, an exponent and a mantissa, and wherein the numerical data include a bit sequence representative of a difference between integers derived from a target actual value of the set and a floating point predicted value related to the target value, the method comprising:
- computing the predicted value, the computing including interpreting as integers, the sign, exponent and/or mantissa of actual values of a subset of the set, and performing integer operations on integers corresponding to the sign, the exponent and/or the mantissa of actual values of the subset, and
- deriving the target actual value from the addition of the bit sequence with an integer derived from the predicted value.

* * * * *